US009755129B2

(12) United States Patent
Strei et al.

(10) Patent No.: US 9,755,129 B2
(45) Date of Patent: Sep. 5, 2017

(54) INTEGRAL THERMOELECTRIC GENERATOR FOR WIRELESS DEVICES

(71) Applicants: David Matthew Strei, Waconia, MN (US); Kelly Michael Orth, Apple Valley, MN (US)

(72) Inventors: David Matthew Strei, Waconia, MN (US); Kelly Michael Orth, Apple Valley, MN (US)

(73) Assignee: Rosemount Inc., Chanhassen, MN (US)

( * ) Notice: Subject to any disclaimer, the term of this patent is extended or adjusted under 35 U.S.C. 154(b) by 188 days.

(21) Appl. No.: 14/460,927

(22) Filed: Aug. 15, 2014

(65) Prior Publication Data

US 2014/0352749 A1 Dec. 4, 2014

Related U.S. Application Data

(63) Continuation of application No. 13/135,229, filed on Jun. 29, 2011, now abandoned.

(51) Int. Cl.
*H01L 35/30* (2006.01)
*F28D 15/02* (2006.01)
(52) U.S. Cl.
CPC .......... *H01L 35/30* (2013.01); *F28D 15/0275* (2013.01)
(58) Field of Classification Search
CPC ............................. H01L 35/30; F28D 15/0275
USPC .................................................. 136/201, 205
See application file for complete search history.

(56) References Cited

U.S. PATENT DOCUMENTS

| | | | | |
|---|---|---|---|---|
| 4,011,104 A | * | 3/1977 | Basiulis ................. | F25B 21/02 136/205 |
| 4,047,093 A | * | 9/1977 | Levoy ...................... | F24J 3/085 165/104.26 |
| 5,048,323 A | | 9/1991 | Stansfeld et al. | |
| 5,079,920 A | | 1/1992 | Whitehead et al. | |
| 5,502,639 A | | 3/1996 | Fukunaga et al. | |
| 5,560,021 A | | 9/1996 | Vook et al. | |
| 5,596,228 A | * | 1/1997 | Anderton ................ | H01L 23/38 257/712 |
| 5,715,684 A | * | 2/1998 | Watanabe ............... | F25B 21/02 62/190 |
| 5,862,391 A | | 1/1999 | Salas et al. | |

(Continued)

FOREIGN PATENT DOCUMENTS

| | | |
|---|---|---|
| CN | 102088260 A | 6/2011 |
| GB | 2145876 A | 4/1985 |

(Continued)

OTHER PUBLICATIONS

Japanese Office Action for Japanese Patent Application No. 2014-518602, dated May 17, 2016, 17 pages.

(Continued)

*Primary Examiner* — Tamir Ayad
(74) *Attorney, Agent, or Firm* — Kinney & Lange, P.A.

(57) ABSTRACT

Electrical power is produced by a first process component, a first heat pipe formed in part by a first cavity within the first process component, and a thermoelectric generator assembly. The thermoelectric generator assembly is thermally coupled on one side to a heat sink and on the other side to the first heat pipe. The first process component is in direct contact with a first process fluid and the first cavity is proximate the first process fluid. The thermoelectric generator assembly produces electrical power.

16 Claims, 25 Drawing Sheets

(56) References Cited

U.S. PATENT DOCUMENTS

| | | |
|---|---|---|
| 6,185,208 B1 | 2/2001 | Liao |
| 6,301,527 B1 | 10/2001 | Butland et al. |
| 6,363,062 B1 | 3/2002 | Aaronsen et al. |
| 6,374,311 B1 | 4/2002 | Mahany et al. |
| 6,485,175 B1 | 11/2002 | Nimberger et al. |
| 6,711,166 B1 | 3/2004 | Amir et al. |
| 6,731,946 B1 | 5/2004 | Stanwood et al. |
| 6,741,554 B2 | 5/2004 | D'Amico et al. |
| 6,775,276 B1 | 8/2004 | Beser |
| 6,826,607 B1 | 11/2004 | Gelvin et al. |
| 6,832,251 B1 | 12/2004 | Gelvin et al. |
| 6,859,831 B1 | 2/2005 | Gelvin et al. |
| 6,891,838 B1 | 5/2005 | Petite et al. |
| 6,971,063 B1 | 11/2005 | Rappaport et al. |
| 6,990,189 B2 | 1/2006 | Ljubicich |
| 7,010,294 B1 | 3/2006 | Pyotsia et al. |
| 7,035,773 B2 | 4/2006 | Keyes et al. |
| 7,042,352 B2 | 5/2006 | Kates |
| 7,053,770 B2 | 5/2006 | Ratiu et al. |
| 7,075,890 B2 | 7/2006 | Ozer et al. |
| 7,075,892 B2 | 7/2006 | Grover et al. |
| 7,114,388 B1 | 10/2006 | French et al. |
| 7,130,915 B1 | 10/2006 | Rustad |
| 7,139,239 B2 | 11/2006 | McFarland |
| 7,155,228 B2 | 12/2006 | Rappaport et al. |
| 7,187,277 B2 | 3/2007 | Kobayashi |
| 7,224,642 B1 | 5/2007 | Tran |
| 7,233,745 B2 | 6/2007 | Loechner |
| 7,246,045 B1 | 7/2007 | Rappaport et al. |
| 7,262,693 B2 | 8/2007 | Karschnia et al. |
| 7,277,401 B2 | 10/2007 | Kyperountas et al. |
| 7,296,416 B2 * | 11/2007 | Akei .................. F25B 1/00 62/238.6 |
| 7,301,454 B2 | 11/2007 | Seyfang et al. |
| 7,327,998 B2 | 2/2008 | Kumar et al. |
| 7,339,489 B2 | 3/2008 | Arita et al. |
| 7,388,886 B2 | 6/2008 | Perkins et al. |
| 7,392,022 B2 | 6/2008 | Albsmeier et al. |
| 7,406,060 B2 | 7/2008 | Periyalwar et al. |
| 7,424,698 B2 | 9/2008 | Honary et al. |
| 7,436,790 B2 | 10/2008 | Todd et al. |
| 7,437,596 B2 | 10/2008 | McFarland |
| 7,440,436 B2 | 10/2008 | Cheng et al. |
| 7,460,865 B2 | 12/2008 | Nixon et al. |
| 7,466,240 B2 | 12/2008 | Evans et al. |
| 7,468,969 B2 | 12/2008 | Zuniga |
| 7,489,282 B2 | 2/2009 | Lastinger et al. |
| 7,505,734 B2 | 3/2009 | Ratiu et al. |
| 7,515,608 B2 | 4/2009 | Yuan et al. |
| 7,536,167 B2 | 5/2009 | Gollnich et al. |
| 7,554,941 B2 | 6/2009 | Ratiu et al. |
| 7,558,622 B2 | 7/2009 | Tran |
| 7,562,393 B2 | 7/2009 | Buddhikot et al. |
| 7,564,842 B2 | 7/2009 | Callaway, Jr. et al. |
| 7,581,053 B2 | 8/2009 | Sichner et al. |
| 7,610,049 B2 | 10/2009 | Watanabe |
| 7,620,409 B2 | 11/2009 | Budampati et al. |
| 7,639,158 B2 | 12/2009 | Kobayashi |
| 7,640,007 B2 | 12/2009 | Chen et al. |
| 7,680,460 B2 | 3/2010 | Nelson et al. |
| 7,697,893 B2 | 4/2010 | Kossi et al. |
| 7,701,858 B2 | 4/2010 | Werb et al. |
| 7,705,729 B2 | 4/2010 | Broad et al. |
| 7,957,708 B2 | 6/2011 | Karschnia et al. |
| 8,827,553 B2 | 9/2014 | Kaul et al. |
| 2002/0167954 A1 | 11/2002 | Highsmith et al. |
| 2002/0178273 A1 | 11/2002 | Pardo-Castellote et al. |
| 2004/0001084 A1 | 1/2004 | Shrinidhi et al. |
| 2004/0090943 A1 | 5/2004 | Costa et al. |
| 2004/0228490 A1 | 11/2004 | Klemba et al. |
| 2004/0259554 A1 | 12/2004 | Rappaport et al. |
| 2004/0259555 A1 | 12/2004 | Rappaport et al. |
| 2005/0009070 A1 | 1/2005 | Arciniegas et al. |
| 2005/0050004 A1 | 3/2005 | Sheu et al. |
| 2005/0074019 A1 | 4/2005 | Handforth et al. |
| 2005/0124346 A1 | 6/2005 | Corbett et al. |
| 2005/0147119 A1 | 7/2005 | Tofano |
| 2005/0149940 A1 | 7/2005 | Calinescu et al. |
| 2005/0192037 A1 | 9/2005 | Nanda et al. |
| 2005/0192727 A1 | 9/2005 | Shostak et al. |
| 2005/0201349 A1 | 9/2005 | Budampati |
| 2005/0208908 A1 | 9/2005 | Karschnia et al. |
| 2005/0213612 A1 | 9/2005 | Pister et al. |
| 2005/0223110 A1 | 10/2005 | Honary et al. |
| 2005/0238058 A1 | 10/2005 | Pierce, Jr. et al. |
| 2006/0002368 A1 | 1/2006 | Budampati et al. |
| 2006/0028997 A1 | 2/2006 | McFarland |
| 2006/0029060 A1 | 2/2006 | Pister |
| 2006/0029061 A1 | 2/2006 | Pister et al. |
| 2006/0039298 A1 | 2/2006 | Zuniga et al. |
| 2006/0064477 A1 | 3/2006 | Renkis |
| 2006/0095539 A1 | 5/2006 | Renkis |
| 2006/0111040 A1 | 5/2006 | Jenkins et al. |
| 2006/0159024 A1 | 7/2006 | Hester |
| 2006/0193262 A1 | 8/2006 | McSheffrey et al. |
| 2006/0215582 A1 | 9/2006 | Castagnoli et al. |
| 2006/0215627 A1 | 9/2006 | Waxman |
| 2006/0219861 A1 | 10/2006 | Wood |
| 2006/0221949 A1 | 10/2006 | Anjum |
| 2006/0227729 A1 | 10/2006 | Budampati et al. |
| 2006/0256722 A1 | 11/2006 | Taha et al. |
| 2006/0274644 A1 | 12/2006 | Budampati et al. |
| 2006/0274671 A1 | 12/2006 | Budampati et al. |
| 2006/0287001 A1 | 12/2006 | Budampati et al. |
| 2007/0030816 A1 | 2/2007 | Kolvaennu |
| 2007/0030832 A1 | 2/2007 | Gonia et al. |
| 2007/0053295 A1 | 3/2007 | Cleveland et al. |
| 2007/0071006 A1 | 3/2007 | Bosch et al. |
| 2007/0147255 A1 | 6/2007 | Oyman |
| 2007/0153817 A1 | 7/2007 | Osann |
| 2007/0160020 A1 | 7/2007 | Osann |
| 2007/0161371 A1 | 7/2007 | Dobrowski et al. |
| 2007/0183439 A1 | 8/2007 | Ossan, Jr. |
| 2007/0184852 A1 | 8/2007 | Johnson et al. |
| 2007/0206503 A1 | 9/2007 | Gong et al. |
| 2007/0206547 A1 | 9/2007 | Gong et al. |
| 2007/0206616 A1 | 9/2007 | Orth |
| 2007/0223310 A1 | 9/2007 | Tran |
| 2007/0230403 A1 | 10/2007 | Douglas et al. |
| 2007/0248047 A1 | 10/2007 | Shorty et al. |
| 2007/0250713 A1 | 10/2007 | Rahman et al. |
| 2007/0257791 A1 | 11/2007 | Arita et al. |
| 2007/0297366 A1 | 12/2007 | Osann |
| 2007/0298805 A1 | 12/2007 | Basak et al. |
| 2008/0016344 A1 | 1/2008 | Holden et al. |
| 2008/0078434 A1 | 4/2008 | Chakraborty |
| 2008/0080364 A1 | 4/2008 | Barak et al. |
| 2008/0083445 A1 | 4/2008 | Chakraborty |
| 2008/0083446 A1 * | 4/2008 | Chakraborty ........... H01L 35/30 136/205 |
| 2008/0125177 A1 | 5/2008 | Gupta |
| 2008/0141769 A1 | 6/2008 | Schmidt et al. |
| 2008/0189394 A1 | 8/2008 | Ross et al. |
| 2008/0273486 A1 | 11/2008 | Pratt, Jr. et al. |
| 2008/0274766 A1 | 11/2008 | Pratt, Jr. et al. |
| 2008/0278145 A1 | 11/2008 | Wenger |
| 2008/0279155 A1 | 11/2008 | Pratt, Jr. et al. |
| 2008/0279204 A1 | 11/2008 | Pratt, Jr. et al. |
| 2008/0298275 A1 | 12/2008 | De Sousa |
| 2009/0010203 A1 | 1/2009 | Pratt, Jr. et al. |
| 2009/0010204 A1 | 1/2009 | Pratt, Jr. et al. |
| 2009/0010205 A1 | 1/2009 | Pratt, Jr. et al. |
| 2009/0010233 A1 | 1/2009 | Pratt, Jr. et al. |
| 2009/0211368 A1 | 8/2009 | Garnett et al. |
| 2009/0222541 A1 | 9/2009 | Monga et al. |
| 2011/0054822 A1 | 3/2011 | Bauschke et al. |
| 2011/0086611 A1 | 4/2011 | Klein et al. |

FOREIGN PATENT DOCUMENTS

| | | | |
|---|---|---|---|
| JP | S6084980 | * 5/1985 | ............ H01L 35/30 |
| JP | S6084980 A | 5/1985 | |
| JP | S60125181 A | 7/1985 | |
| JP | S61167479 A | 7/1986 | |

(56) References Cited

FOREIGN PATENT DOCUMENTS

| JP | S6374976 | 4/1988 |
|---|---|---|
| JP | H08107688 A | 4/1996 |
| JP | H1141863 A | 2/1999 |
| JP | H11215867 A | 8/1999 |
| JP | 2010505382 A | 2/2010 |
| JP | 2010505383 A | 2/2010 |
| WO | 03023536 A1 | 3/2003 |
| WO | 2007146565 A2 | 12/2007 |

OTHER PUBLICATIONS

International Search Authority, International Search Report and Written Opinion, Dec. 27, 2012, 13 pages.
State Intellectual Property Office of People's Republic of China, First Office Action, Application No. 201210147481.X Nov. 23, 2015, 3 pages.
Japanese Office Action, for Japanese Patent Application No. 2014-518602, dated Oct. 26, 2016, 12 pages.

* cited by examiner

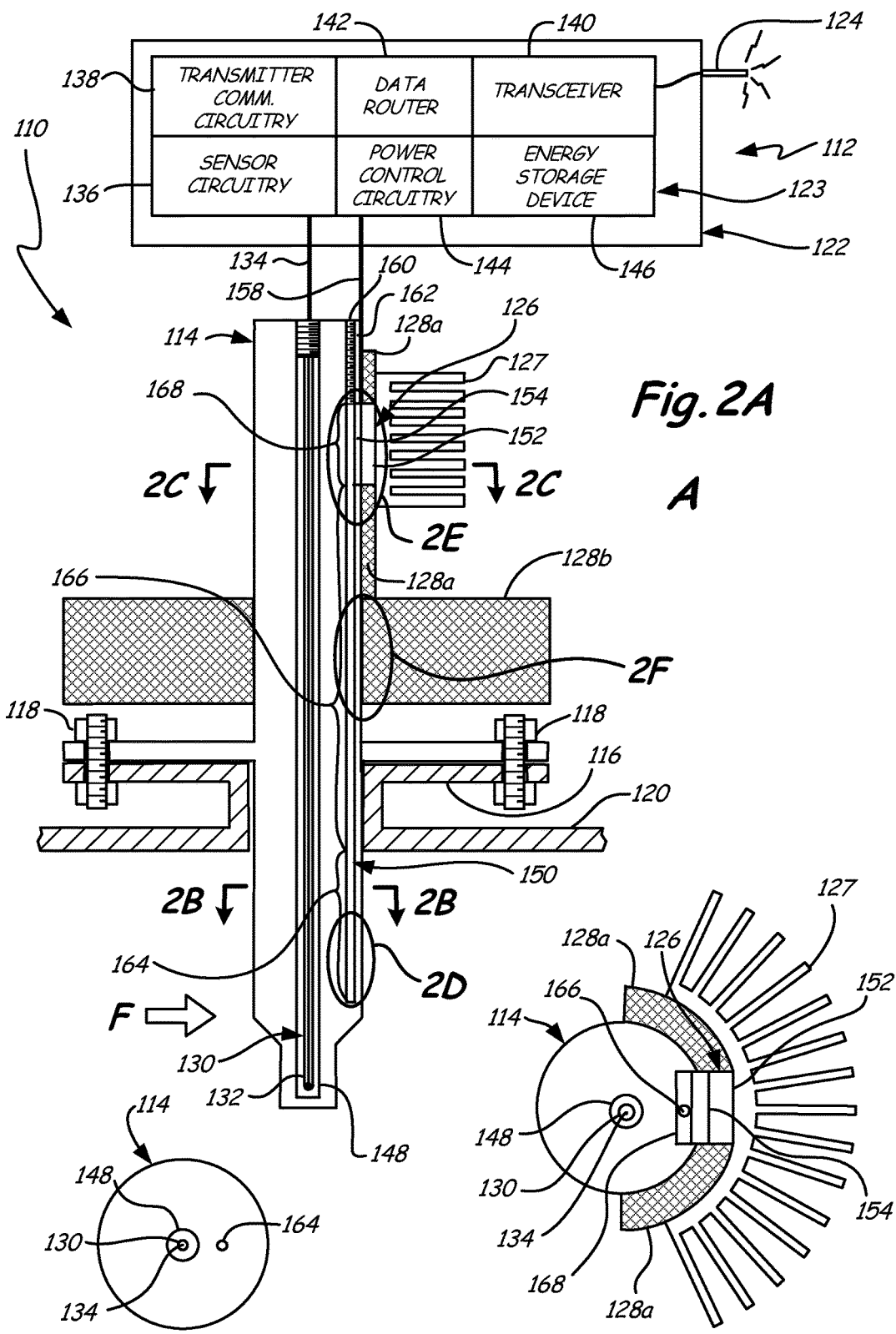

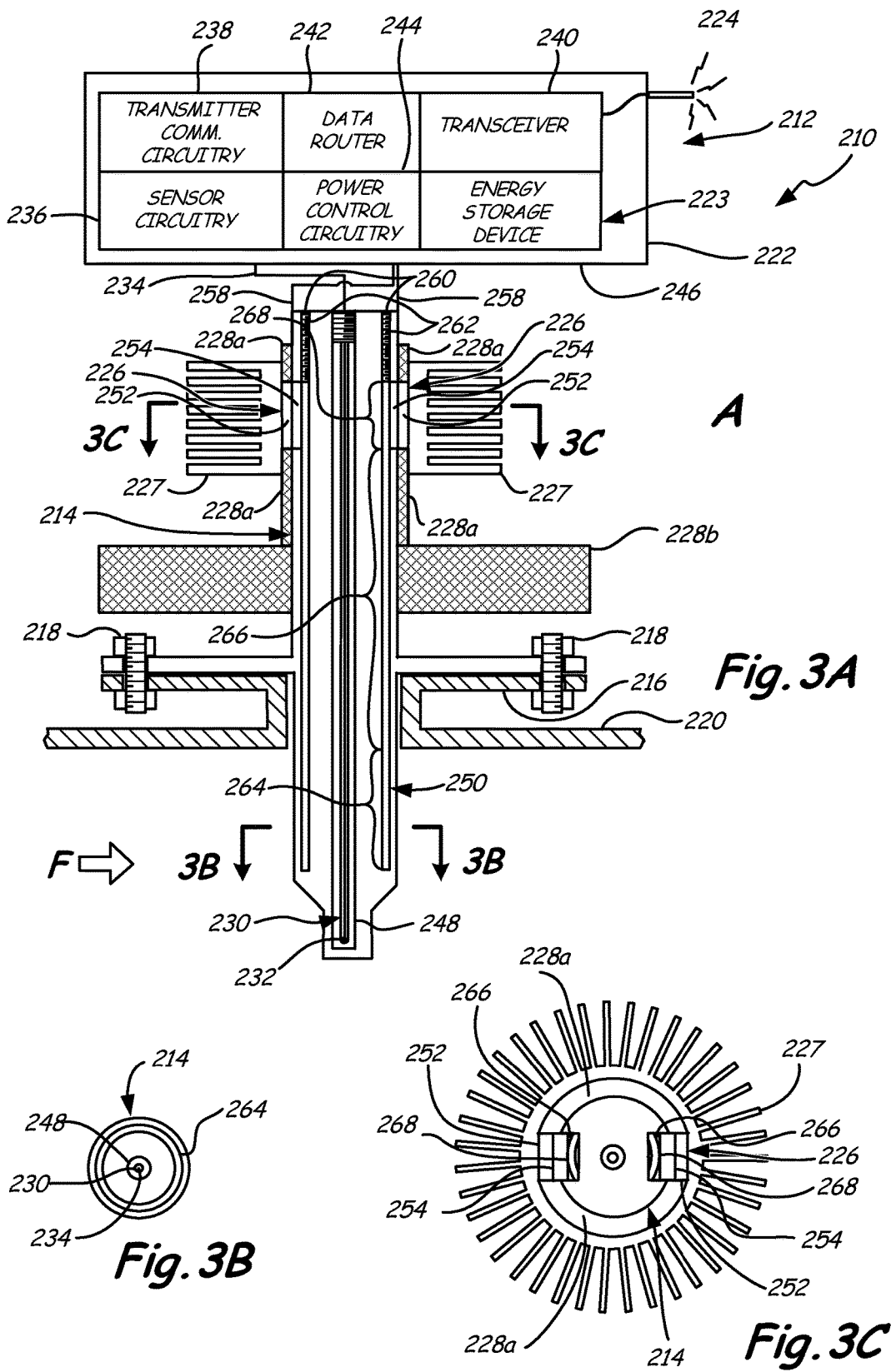

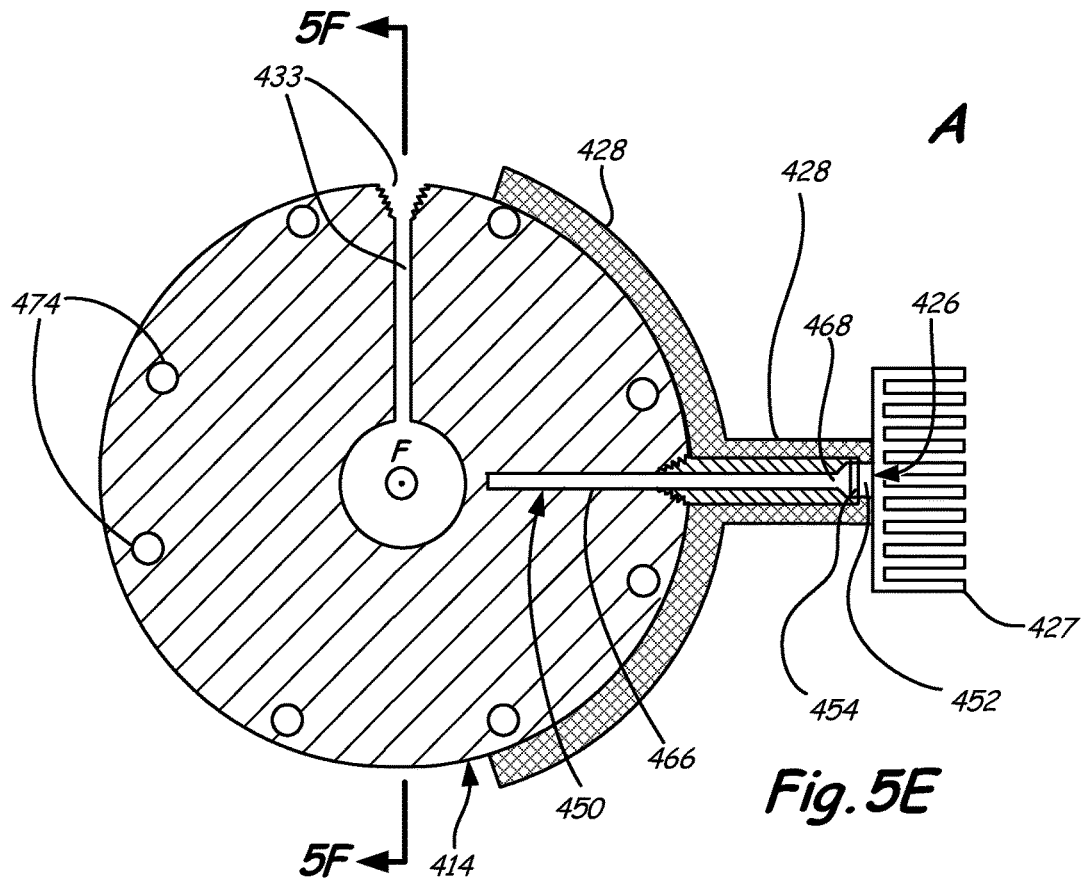
Fig. 5E
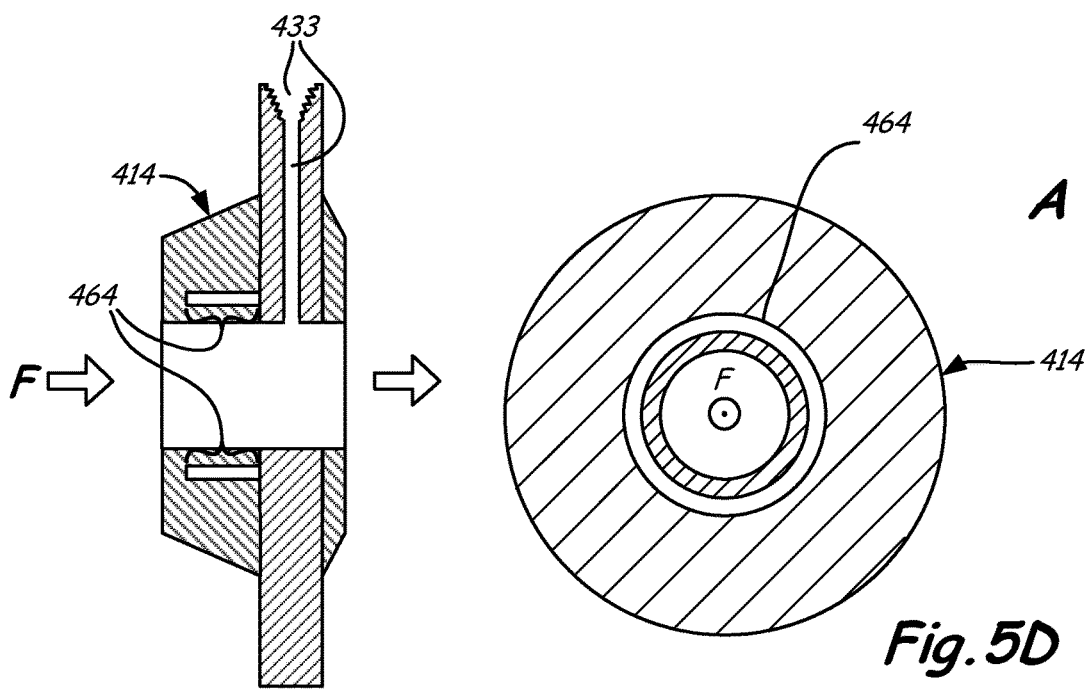
Fig. 5F
Fig. 5D

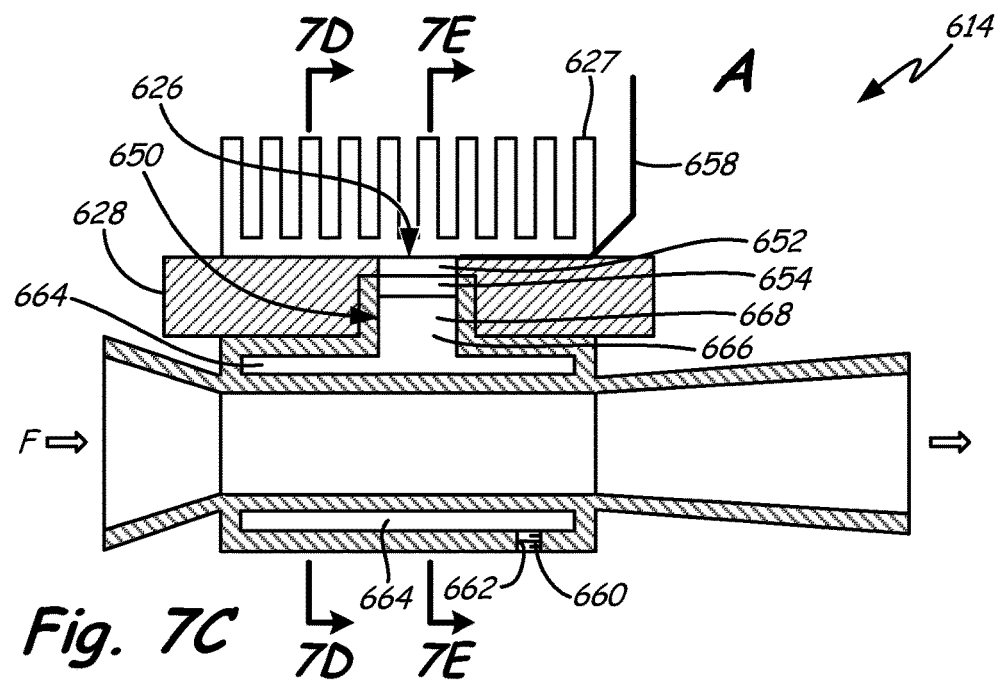
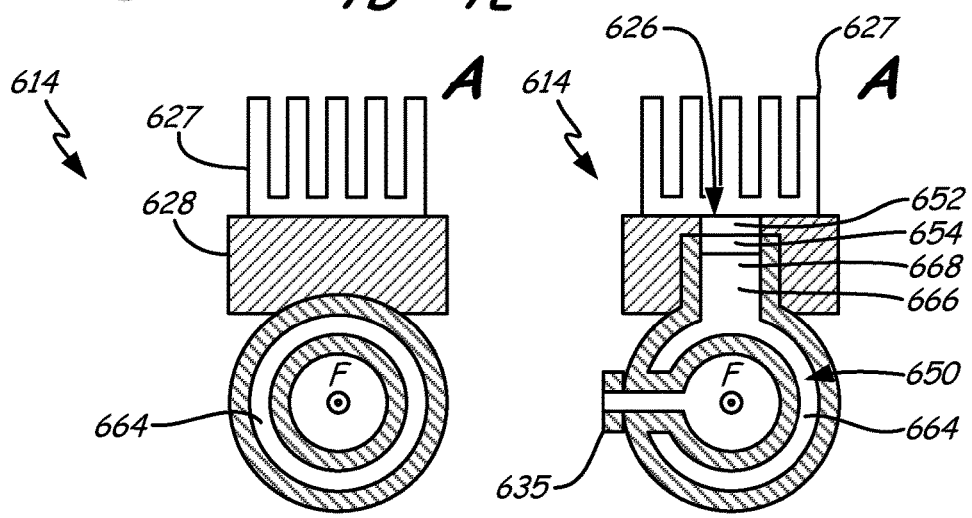
Fig. 7C
Fig. 7D    Fig. 7E

INTEGRAL THERMOELECTRIC GENERATOR FOR WIRELESS DEVICES

CROSS-REFERENCE TO RELATED APPLICATION(S)

This application is a continuation of U.S. patent application Ser. No. 13/135,229, entitled "INTEGRAL THERMOELECTRIC GENERATOR FOR WIRELESS DEVICES" filed Jun. 29, 2011 by David Matthew Strei, et al., which is hereby incorporated by reference.

BACKGROUND

The present invention relates generally to wireless devices and, more particularly, to powering wireless devices in a wireless field device network.

Wireless devices are becoming prevalent in industrial applications. As components of wireless field device networks, wireless devices extend the reach of control or process monitoring systems beyond that of wired devices to locations where wiring may be difficult and expensive to provide. A wireless field device network includes a cloud of wireless devices or nodes with a central controller or gateway. The nodes in the wireless network are able to both send and receive information.

Wireless field device networks are used to control and monitor disparate processes and environments. For example, wireless field device networks may be used in oil fields. An oil field is composed of numerous discrete locations centered on well pads that are scattered over large areas. Communication between these isolated local areas is essential to the overall management of the field. The wireless field device network at a well pad monitors and controls everything from flow rates, well pressure, and fluid temperature to valve status and position and potential leaks. The resulting data is relayed through the network to controllers that analyze the data and actuate control mechanisms in order to manage production or prevent trouble.

A wireless field device network is a communication network made up of a plurality of wireless devices (i.e., nodes) organized in a wireless topology. Example of wireless topologies include mesh networks, such as, for example, WIRELESSHART® networks, and star networks such as, for example, BLUETOOTH® networks. In a wireless field device network, a wireless device is one of a wireless transceiver, a wireless data router, and a wireless field device. A wireless transceiver includes a transceiver and an antenna integrated into a single device. A wireless data router includes a wireless transceiver and a data router integrated into a single device. A wireless field device includes a wireless data router and a field device integrated into a single device. A field device is a field-mounted device that performs a function in a control or process monitoring system or plant monitoring system, including all devices used in the measurement, control and monitoring of industrial plants, processes or process equipment, including plant environmental, health and safety devices. A field device typically includes at least one transducer, such as, for example, a sensor or an actuator, and may perform a control or alert function. A wireless transceiver is a device for transmitting and receiving RF-based communication data. A data router is a device that routes data packets received by a wireless transceiver, unpacking the communication payload for consumption by an attached field device (if that device's address matches the final destination address in the packet) or redirecting the communication payload back to the wireless transceiver to be relayed back into the network to the next destination in the logical path. For example, in a wireless mesh network, because each wireless device must be capable of routing messages for itself as well as other devices in the network, each wireless device includes a data router. In contrast, in a simple star network, where wireless devices need only to send and receive messages, wireless devices need not include a data router.

The use of lower power RF radios is essential for wireless network systems designed for transducer-based applications, such as a wireless field device network. Many devices in the network must be locally-powered because power utilities, such as 120V AC utilities or powered data buses, are not located nearby or are not allowed into hazardous locations where instrumentation and transducers must be located without incurring great installation expense. "Locally-powered" means powered by a local power source, such as a portable electrochemical source (e.g., long-life batteries or fuel cells) or by a low-power energy-scavenging power source (e.g., vibration, solar, or thermoelectric). A common characteristic of local power sources is their limited power capacity, either stored, as in the case of a long-life battery, or produced, as in the case of a solar panel. Batteries are expected to last more than five years and preferably last as long as the life of the product.

SUMMARY

An embodiment of the present invention includes a first process component, a first heat pipe formed in part by a first cavity within the first process component, and a thermoelectric generator assembly. The thermoelectric generator assembly is thermally coupled on one side to a heat sink and on the other side to the first heat pipe. The first process component is in direct contact with a first process fluid and the first cavity is proximate the first process fluid. The thermoelectric generator produces electrical power.

Another embodiment of the present invention is a method for generating electrical power for use in a wireless field device network. A process component contacts a process fluid. Heat conducts between the process fluid and a surface of a sealed cavity within the process component. Heat transfers between the surface of a sealed cavity and a thermoelectric generator assembly by the vaporizing and condensing of a working fluid. Heat transfers between the thermoelectric generator assembly and a heat sink by at least one of convection and conduction. Electrical power is generated from the conduction of heat through the thermoelectric generator assembly.

BRIEF DESCRIPTION OF THE DRAWINGS

FIGS. 2A-2F illustrate an embodiment of the present invention incorporated into a thermowell for powering a wireless temperature measurement field device.

FIGS. 3A-3C illustrate another embodiment of the present invention incorporated into a thermowell for powering a wireless temperature measurement field device.

FIGS. 5A-5F illustrate an embodiment of the present invention incorporated into an orifice plate flange for powering a wireless flow measurement field device.

FIGS. 7A-7E illustrate an embodiment of the present invention incorporated into a Venturi tube for powering a wireless flow measurement field device.

DETAILED DESCRIPTION

Figure 1A:
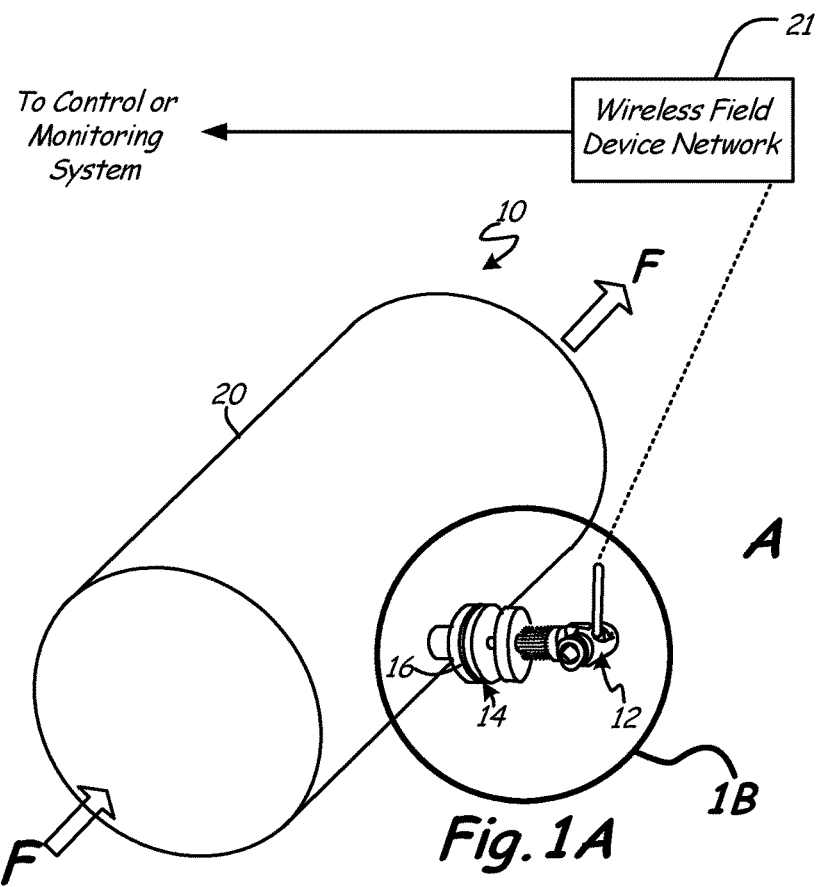
FIGS. 1A-1B illustrate a wireless field device incorporating the present invention mounted on a process flange.

The present invention will be discussed in terms of powering wireless devices in a wireless field device mesh network. A person skilled in the art will recognize that the invention is equally suited to other network topologies and is not limited to solely the embodiments described, but that the invention will include all embodiments falling within the scope of the appended claims.

The present invention powers wireless devices in a wireless field device network using thermoelectric power generation. As noted above, batteries are expected to last more than five years and preferably last as long as the life of the product. However, in some applications requiring frequent communication, sensing, or actuation, batteries sufficient to provide power for a reasonable length of time are prohibitively large. This is aggravated in severe climates where low temperatures limit battery output or high temperatures limit battery lifetime. In locations where available solar radiation is very limited, for example, near the Arctic Circle, solar panels also must be prohibitively large and expensive to provide the necessary power. Often these applications involve process fluids at temperatures greatly above or below ambient conditions, suggesting the use of thermoelectric power generation. However, thermoelectric power generation is inherently inefficient. Significant improvement in the efficiency of thermoelectric power generation is essential to meet the energy requirements for a wireless device in a wireless field device network.

The conversion efficiency of a thermoelectric generator is generally less than 1% and is a function of the material and design of the thermoelectric generator. In addition, the amount of heat available to the thermoelectric generator for conversion is greatly reduced by a series of the thermal resistances between the source of the heat (or cold) and the surface of the thermoelectric generator. The thermal resistances slow the transfer of heat for a given cross-sectional area perpendicular to the direction of heat flow, decreasing heat transfer rate per area, or heat flux.

For example, a typical thermoelectric generator application is a hot fluid in a vessel (e.g., flowing through a pipe or contained within a tank) surrounded by cooler air, with one side of a thermally conductive element attached to an external, uninsulated section of the vessel (strapping it on), and with the other side of the thermally conductive element in physical contact with one surface of a thermoelectric generator. A heat exchanger in contact with the ambient air is attached to the other surface of the thermoelectric generator. There are three significant thermal resistances to the heat flux from the hot fluid in the vessel to the thermoelectric generator: the vessel wall, the physical contact (or lack of physical contact) between the thermally conductive element and the vessel surface, and the thermal resistance through the thermally conductive element.

Vessel walls are generally made of materials with poor thermal conductivity such as, for example, iron (60 W/mK), stainless steel (10 to 40 W/mK), or Hastelloy (10 W/mK). The heat flux must penetrate the full thickness of the vessel wall to reach the thermally conductive element. Once the heat flux reaches the external vessel wall surface, it must flow into the thermally conductive element. Attachment of such a device to a curved vessel surface, such as a pipe or tank, is fraught with challenges. The radius of curvature of the thermally conductive element must match exactly that of the external vessel surface. Vessel sizes and surface textures vary dramatically making the required precise fit exceptionally difficult. A few point contacts between the two mating surfaces must support virtually the entire heat flow across the area of the mating surfaces, with small air gaps (excellent insulators) occupying the bulk of the interface. The heat flow that does penetrate the vessel wall and cross the interface between the external vessel surface and the thermally conductive element must then conduct through the thermally conductive element to reach the surface of the thermoelectric generator. Thermally conductive elements are typically made of a material with high thermal conductivity, for example, copper (400 W/mK), but still provide another thermal resistance to the heat flow, limiting the heat flux available to the thermoelectric generator. The present invention greatly reduces, or eliminates altogether, all three series thermal resistances to heat flow from a process fluid to a thermoelectric generator, significantly improving the heat flux available for conversion by the thermoelectric generator.

The present invention provides power to a wireless device in a wireless field device network with a thermoelectric generator. The invention includes a process component directly contacting a process fluid. Process components that directly contact a process fluid include, for example, thermowells, averaging pitot tubes, pipe flanges, orifice plate flanges, steam traps, pressure sensor remote seals, level switches, contacting radar level gauges, vortex flow meters, coriolis meters, magnetic flow meters, turbine meters, valve manifolds, flow straightening elements, flow restrictors, control valves, shut-off valves, filter housings, pump housings, and pressure relief valves. The process component in the present invention contains a heat pipe formed in part by a heat collector cavity internal to the process component. The heat collector cavity is employed solely to form a portion of the heat pipe. The heat pipe couples to one side of the thermoelectric generator and a heat sink couples to the other side of the thermoelectric generator, transferring heat through the thermoelectric generator to generate electrical power for the wireless device. The heat pipe replaces the thermally conductive element describe above, greatly reducing the thermal resistance associated with transferring heat to the surface of the thermoelectric generator. Imbedding the heat pipe within a process component in direct contact with the process fluid eliminates the other two thermal resistances by penetrating the vessel wall directly. The process component does not strap on to the vessel, but penetrates or replaces a section of the vessel wall. Some thermal resistance remains from the need to conduct heat from the process fluid to the heat pipe cavity through the portion of the process component separating the heat collector cavity from the process fluid. However, because the heat flows into the heat pipe from the entire surface area of the heat collector cavity and is transported by the heat of vaporization from the entire internal heat collector cavity surface, the heat flux transported by the heat pipe is much higher.

Figure 1B:
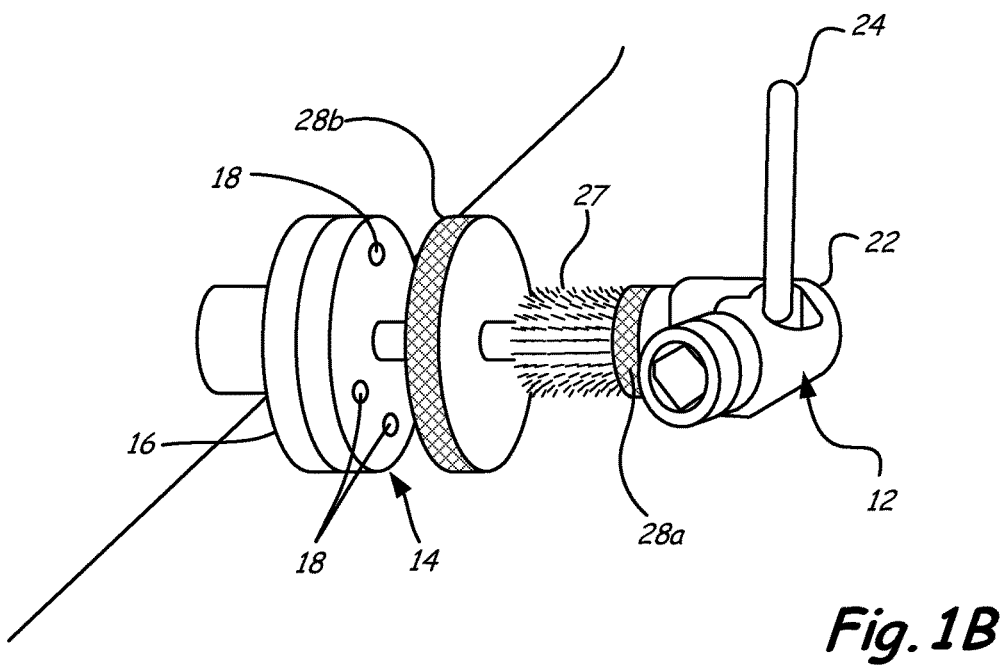

FIGS. 1A-1B illustrate an embodiment of the present invention for powering a wireless device in a wireless field device network comprising a thermoelectric generator incorporated into a process component. FIGS. 1A-1B illustrate a process component incorporating the present invention mounted on a process flange. FIG. 1B is a portion of FIG. 1A enlarged to better illustrate details of the invention.

FIG. 1A shows process measurement or control point 10, including wireless field device 12, process component 14, process flange 16, process piping 20 and wireless field device network 21. As shown in FIG. 1B, wireless field device 12 comprises electronics housing 22, an electronics circuit (not shown), antenna 24 and a transducer (not shown). Process component 14 is a flange-mounted component comprising a thermoelectric generator assembly (not shown), heat transfer device 27, insulation 28a, insulation 28b, and a heat pipe (not shown). FIG. 1B also shows a plurality of flange bolts 18. Although process piping 20 is illustrated as a pipe, it may also be any of a number of process vessels including a process tank, storage tank, heat exchanger, boiler, distillation column, kiln, or reactor. Wireless field device network 21 is any wireless field device network capable of wireless communication with wireless field device 12 and of communication with a control or monitoring system. Wireless field device network 21 is, for example, a wireless field device mesh network.

Process flange 16 is attached (generally welded) to an opening in process piping 20 to create a port into process piping 20. A sealing gasket (not shown), which is generally composed of material of low thermal conductivity, is inserted between the mating surfaces of process component 14 and process flange 16 before process component 14 is attached to the port to be in direct contact with process fluid F when it flows through process piping 20. Process component 14 connects to process flange 16 with the plurality of flange bolts 18. The thermoelectric generator assembly is integrated with process component 14 and is indirectly in thermal contact with process fluid F. The heat pipe (not shown) thermally connects process fluid F and the thermoelectric generator. The thermoelectric generator assembly is also in thermal contact with heat transfer device 27 which is in thermal contact with a heat sink, for example, ambient fluid A. Ambient fluid A surrounds process measurement or control point 10 and is typically air. During normal operations, process fluid F and ambient fluid A are at different temperatures. Insulation 28a and insulation 28b are positioned to thermally shield heat transfer device 27 in thermal contact with fluid A from portions of process component 14 in thermal contact with fluid F. As shown in FIG. 1, process component 14 is physically and electrically connected to wireless field device 12, providing an interface between the process fluid F and the transducer. Alternatively, electronics housing 22, antenna 24 and the electronics circuitry of wireless field device 12 are physically separate from, but electrically connected to, process component 14.

In operation, a heat flow driven by the temperature difference between process fluid F and ambient fluid A is transported by the heat pipe in process component 14. In the case where the temperature of process fluid F is higher than the temperature of ambient fluid A, the heat flow is from process fluid F located in process piping 20 to the thermoelectric generator assembly by way of the heat pipe. The heat flow is conducted through the thermoelectric generator assembly by the dissipation of the heat into ambient fluid A by heat transfer device 27, generating electrical power. The heat flow is in the opposite direction for the case where the temperature of process fluid F is lower than the temperature of ambient fluid A. The electrical power is conducted to wireless device 12, providing power to wireless field device 12 for use in operating the transducer and for use in communicating with wireless field device network 21 through antenna 24. Parallel paths for heat flow between process fluid F and ambient fluid A that would tend to circumvent the intended path through the thermoelectric generator assembly are reduced by insulation 28a and insulation 28b.

Figure 10:
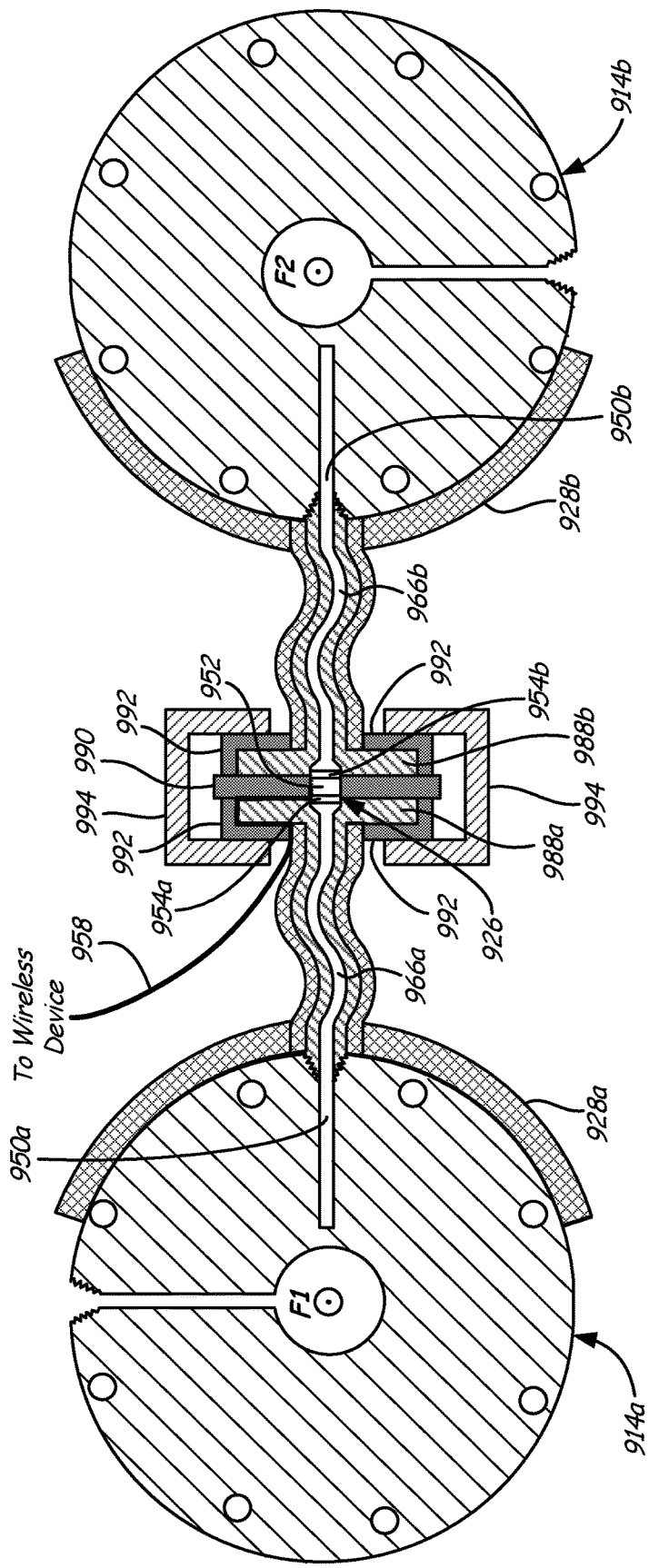
FIG. 10 illustrates an embodiment of the present invention incorporated into each of two process components for powering a wireless flow measurement field device.

All embodiments described below, except for the embodiment illustrated by FIG. 10, are for the case where the temperature of process fluid F is higher than the temperature of the heat sink and the direction of heat flow is from process fluid F to the heat sink. It is understood that for all subsequently described embodiments, for the case where the temperature of process fluid F is lower than the temperature of the heat sink, the description is the same, with only the direction of heat flow reversed, with heat flowing from the heat sink to process fluid F.

In all embodiments, a heat sink absorbs or carries away heat to maintain a steady heat flow through the thermoelectric element. For ease of illustration, in all embodiments described below, except for the embodiment illustrated by FIG. 10, the heat sink is ambient fluid A. Ambient fluid A is often air, but it is understood that ambient fluid A may be another type of fluid, such as a cooling fluid, a body of water, or a second process fluid in physical contact with a heat transfer device. In addition, the heat sink may be earth or another large thermal mass, for example, a wall of a building, or an earthen berm.

Wireless field devices like that described in FIG. 1 can measure any of a number of process characteristics such as, for example, pressure, flow velocity, mass flow, pH, temperature, density, and conductivity; or can monitor process equipment for such things as vibration, strain, or corrosion; or can monitor a general plant environment for such things as fire and gas detection; or can locate the present position of workers and equipment. FIGS. 2A-2F illustrate an embodiment of the present invention for powering a wireless device in a wireless field device mesh network comprising a thermoelectric generator incorporated into a process component for powering a wireless temperature measurement field device, where the process component is a thermowell. A thermowell is a sturdy, protective sheath designed to accommodate and protect a temperature sensor from the harmful effects of a fluid under measurement, including vibration, impact, corrosion, and abrasion. The temperature sensor is inserted into the thermowell along its axis and the thermowell is inserted into a process vessel containing the fluid under measurement. Thermowells also provide an additional advantage of permitting replacement of a failed temperature sensor without having to shut down the process and open up the vessel.

FIG. 2A shows a cross-section of a thermowell incorporating the present invention. FIG. 2A shows process measurement point 110, including wireless field device 112, thermowell 114, process flange 116, flange bolts 118 and process piping 120 containing process fluid F. A heat sink is provided by ambient fluid A. Ambient fluid A surrounds process measurement point 110 and is typically air. Although process piping 120 is illustrated as a pipe as in FIG. 1, it may also be any of a number of process vessels including a process tank, storage tank, heat exchanger, boiler, distillation column, kiln, or reactor. Wireless field device 112 comprises electronics housing 122, electronics circuitry 123, antenna 124, and temperature probe 130. Temperature probe 130 comprises temperature sensor 132 and temperature sensor wires 134. Temperature sensor 132 is any sensor that varies an electrical characteristic in response to temperature changes, for example, a thermocouple or an RTD. Temperature sensor wires 134 are wires compatible with temperature sensor 132, for example, thermocouple wire. Electronics circuitry 123 comprises sensor circuitry 136, transmitter communication circuitry 138, transceiver 140, data router 142, power control circuitry 144, and energy storage device 146. Sensor circuitry 136 processes sensor signals and provides sensor excitation as is known in the art. Transmitter communication circuitry 138 comprises communication circuitry for sending and receiving wired signals, for example, HART® communication protocol data. Transceiver 140 is a device for transmitting and receiving RF-based communication data, for example, WIRELESSHART® data. Data router 142 is a device that routes data packets. Power control circuitry 144 receives incoming power and conditions it as necessary for use by the other components of electronics circuitry 123. Energy storage device 146 stores energy for use by the other components of electronics circuitry 123 and is, for example, a primary battery, a rechargeable battery, a supercapacitor, or an energy storage capacitor as is known in the art. Thermowell 114 is a flange-mounted process component comprising thermoelectric generator assembly 126, heat transfer device 127, insulation 128a, insulation 128b, thermowell cavity 148, and heat pipe 150. Thermoelectric generator assembly 126 comprises thermoelectric element 152, heat spreader 154, and power cable 158. Thermoelectric element 152 is a device that produces voltage across the device and an electric current through the device (when connected to an electrical load) when opposite sides of the device are held at different temperatures, for example, a semiconductor-based device of a type known in the art made of a series of alternating n-type and p-type semiconductors. Heat spreader 154 is a block of high thermal conductivity material, for example, copper, employed to even out the heat flux over the surface of thermoelectric element 152. Heat transfer device 127 is any device for efficiently exchanging heat with ambient fluid A. As illustrated, heat transfer device 127 is a pin-fin heat exchanger made of a high thermal conductivity material, for example, copper, and is designed with large ratio of surface area to volume to enhance the transfer of heat. Insulation 128a and insulation 128b are any type of durable, thermally insulating structures compatible with ambient fluid A. In this embodiment, heat pipe 150 includes fill port 160, plug 162, heat collector cavity 164, heat transport pipe 166, and heat dissipater cavity 168. Plug 162 is any plug that seals, for example, a threaded metal plug. Heat collector cavity 164 is that portion of heat pipe 150 imbedded within the portion of thermowell 114 that is in direct contact with process fluid F. Heat dissipater cavity 168 is that portion of heat pipe 150 that is in direct contact with thermoelectric generator assembly 126. Heat transport pipe 166 is that portion of heat pipe 150 connecting heat collector cavity 164 to heat dissipater cavity 168.

Figure 2D:
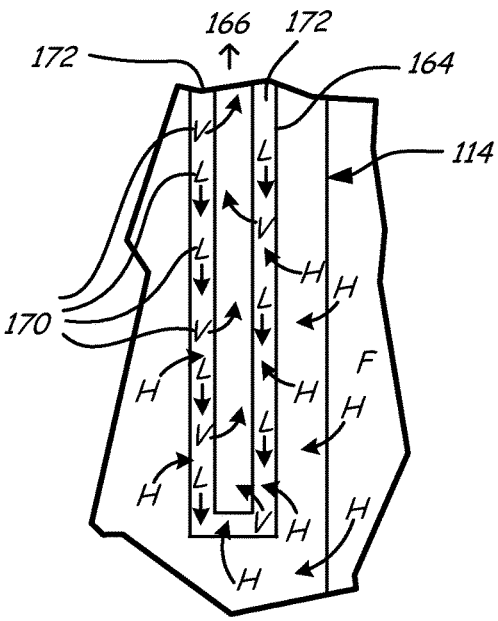

Process flange 116 is attached (generally welded) to an opening in process piping 120 to create a port into process piping 120. A sealing gasket (not shown) is inserted between the mating surfaces of thermowell 114 and process flange 116 before thermowell 114 is inserted into the port to be in direct contact with process fluid F when it flows through process piping 120 as shown in FIG. 2A. Thermowell 114 connects to process flange 116 at a flanged portion of thermowell 114 with a plurality of flange bolts 118 (typically four or more, two shown). Temperature probe 130 is inserted into thermowell cavity 148 such that temperature sensor 132 is at or near the end of thermowell 114 furthest into process fluid F. Temperature probe 130 is generally held in place by a threaded connection near the end of temperature probe 130 opposite that of temperature sensor 132. Temperature sensor wires 134 connect temperature probe 130 to electronics circuitry 123 within electronics housing 122 at sensor circuitry 136. Antenna 124 connects to electronics circuitry 123 within electronics housing 122 at transceiver 140. Within electronics circuitry 123, sensor circuitry 136 connects to transmitter communication circuitry 138. Transmitter communication circuitry 138 connects to data router 142 which connects to transceiver 140. Power control circuitry 144 connects to energy storage device 146, sensor circuitry 136, transmitter communication circuitry 138, data router 142, and transceiver 140. Heat pipe 150 extends from heat collector cavity 164, described below in reference to FIG. 2D, to heat transport pipe 166, described below in reference to FIG. 2F, to heat dissipater cavity 168, described below in reference to FIG. 2E. Plug 162 seals off fill port 160. Heat dissipater cavity 168 of heat pipe 150 connects to thermoelectric generator assembly 126 at heat spreader 154. Heat spreader 154 is intimately attached to one side of thermoelectric element 152 and heat transfer device 127 is intimately attached to the other side of thermoelectric element 152, opposite heat spreader 154. Power cable 158 connects thermoelectric element 152 to electronics housing 122 at power control circuitry 144. Insulation 128a is positioned in a gap between heat transfer device 127 and the external surface of thermowell 114, with insulation 128a extending beyond the edges of heat transfer device 127 to insure good thermal isolation. Insulation 128b is positioned in the space between heat transfer device 127 and the flanged portion of thermowell 114 attached to process flange 116. Thermowell 114 is physically and electrically connected to wireless field device 112, providing an interface between process fluid F and temperature probe 130. Alternatively, electronics housing 122, electronics circuitry 123, and antenna 124 are physically separate from, but electrically connected to, temperature probe 130 and thermowell 114.

In operation, temperature sensor 132 varies an electrical characteristic in response to a change in the temperature of process fluid F. The variation in electrical characteristic is conducted via temperature sensor wires 134 to sensor circuitry 136. Sensor circuitry 136 translates the change in electrical characteristic into a temperature measurement. Sensor circuitry 136 sends the temperature measurement to transmitter communication circuitry 138 which sends the temperature measurement and any additional information (e.g., wireless field device ID) over a wired link (not shown) to data router 142. Data router 142 formats the information into a digital data packet along with information on a transmission destination and sends the digital data packet to transceiver 140 for transmission into a wireless field device mesh network via antenna 124.

In addition, as a member of the wireless field device mesh network, wireless field device 112 may also route data packets received from the wireless field device mesh network. Transceiver 140 receives digital data packets from the wireless field device mesh network via antenna 124 and sends the digital data packets to data router 142. Data router 142 routes the data packets received by transceiver 140, unpacking the communication payload for consumption by transmitter communication circuitry 138, if the device address of wireless field device 112 matches the final destination address in the packet, or redirecting the digital data packets back to transceiver 140 to be relayed back into the network via antenna 124 to the next destination in the logical path.

At least a portion of the power for the temperature sensing and data transmission described above is supplied in the embodiment of the present invention by the operation of thermoelectric generator assembly 126 with a heat flow efficiently supplied by heat pipe 150. Heat collector cavity 164 collects heat from process fluid F as described below in reference to FIG. 2D. Heat transport pipe 166 transfers the heat from heat collector cavity 164 to heat dissipater cavity 168 as described below in reference to FIG. 2F. At heat dissipater cavity 168, heat is transferred into heat spreader 154, (as described below in reference to FIG. 2E) which evens out the heat flux as the heat flow conducts through heat spreader 154 to thermoelectric element 152. As the heat flows through thermoelectric element 152, a voltage is generated as a function of the amount of heat flowing through thermoelectric element 152, and current flows to wireless field device 112. The generation of both a voltage and a current produce electrical power. If heat is not removed from the side opposite heat spreader 154, thermal equilibrium is quickly reached and heat flow ceases along with the power production. Continuous power production requires removing heat from the side of the thermoelectric element 152 opposite heat spreader 154. Heat transfer device 127, with its large surface area, efficiently removes heat from the side of thermoelectric element 152 opposite heat spreader 154 by conduction to ambient fluid A. Ambient fluid A, through convection, conduction or a combination of the two, absorbs or carries away the heat from heat transfer device 127, thus maintaining the steady heat flow through thermoelectric element 152 necessary for continuous power production. In this embodiment, insulation 128a and insulation 128b reduce heat entering heat transfer device 127 from sources other than thermoelectric element 152 by insulating areas likely to be at a temperature between process fluid F and ambient fluid A, such as exterior surfaces of thermowell 114 and process piping 120. This improves the efficiency of thermoelectric generator assembly 126 by limiting the heat to be removed by heat transfer device 127 mainly to the heat flowing through thermoelectric element 152. Power produced by thermoelectric element 152 is conducted by power cable 158 to power control circuitry 144. Power control circuitry 144 conditions the power and distributes it as needed to sensor circuitry 136, transmitter communication circuitry 138, data router 142, and transceiver 140 for the temperature sensing and data transmission operations described above. Optionally, power in excess of the immediate requirements for temperature sensing and data transmission operations is stored in energy storage device 146. Power stored in energy storage device 146 is tapped by power control circuitry 144 when temperature sensing and data transmission operation requirements exceed the power immediately available from thermoelectric generator assembly 126, for example, during process start up or shut down when the temperature of process fluid F is lower than during normal process operation.

According to one embodiment, FIG. 2B is a cross-section of a portion of thermowell 114 that is in direct contact with process fluid F. As shown in FIG. 2B, heat collector cavity 164 has a circular cross-section. The tubular shape of heat collector cavity 164 is efficiently created by, for example, drilling. The tubular shape continues throughout heat pipe 150, with the exception of heat dissipater cavity 168.

FIG. 2C illustrates one embodiment of a shape of heat dissipater cavity 168. The circular cross-section of heat transfer pipe 166 terminates at the edge of heat dissipater cavity 168. Heat dissipater cavity 168 is a rectangular cavity matching the rectangular shape of heat spreader 154. This shape is also efficiently created by manufacturing methods know in the art. Heat dissipater cavity 168 is comprised of interior surfaces of thermowell 114 on five of six sides and of heat spreader 154 on the remaining side. FIG. 2C further illustrates the shape of heat transfer device 127. Heat transfer device 127 wraps partially around the exterior of thermowell 114 to increase the surface area of heat transfer device 127. As mentioned above, insulation 128a preferably fills the gap between the portions of heat transfer device 127 that extend beyond thermoelectric element 152 and the exterior of thermowell 114. Insulation 128a extends beyond the edges of heat transfer device 127 in all directions to insure good thermal isolation from the exterior surfaces of thermowell 114, which are at a temperature between that of process fluid F and ambient fluid A.

An essential element in the efficient operation of the embodiment shown in FIG. 2A is the operation of heat pipe 150. FIG. 2D illustrates the heat transport mechanism working to transfer heat from process fluid F into heat pipe 150. FIG. 2D is a cross-section of a portion of heat collector cavity 164. In this embodiment, heat pipe 150 further comprises working fluid 170 and wicking device 172. Working fluid 170 is preferably present in heat pipe 150 in both liquid (L) and vapor (V) phases. Working fluid 170 is selected depending on the expected operating temperature range between that of process fluid F and ambient fluid A and is, for example, water, ammonia, methanol, or ethanol. Preferably, wicking device 172 is a material with sufficiently small pores to exert significant capillary pressure on the liquid phase of working fluid 170 and easily wetted by working fluid 170, for example, sintered ceramic, metal mesh, metal felt, or metal foam. Alternatively, wicking device 172 comprises grooves in the side of heat pipe 150 running the length of heat pipe 150, sized to provide the required capillary pressure on the liquid phase of working fluid 170.

According to one embodiment, wicking device 172 lines the sides of heat collector cavity 164 and contains working fluid 170 in L phase. In operation, heat H from process fluid F flows through the metal walls surrounding heat collector cavity 164. L phase working fluid 170 in heat collector cavity 164 absorbs the heat flow and changes to V phase working fluid 170 once the absorbed heat reaches the heat of vaporization for working fluid 170. V phase working fluid 170 expands out of wicking device 172 into the interior of heat collector cavity 164, increasing the pressure in heat collector cavity 164 and driving V phase working fluid 170 to flow out of heat collector cavity 164 into heat transport pipe 166. Simultaneously, the vaporization of L phase working fluid 170 from wicking device 172 permits more L phase working fluid 170 to flow into heat collector cavity 164 from heat transport pipe 166 driven by capillary pressure in wicking device 172. In this manner, heat flows efficiently from process fluid F into and out of heat collector cavity 164. Although the most efficient heat flow is through the thinnest portion of thermowell 114 separating heat collector cavity 164 from process fluid F, conduction of heat throughout the portion of thermowell 114 in contact with process fluid F provides heat to flow into heat collector cavity 164 from all directions.

Figure 2F:
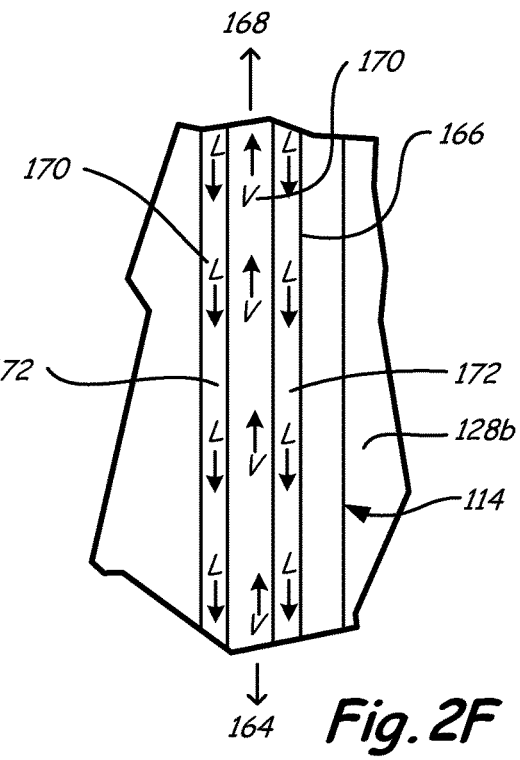
Figure 2E:
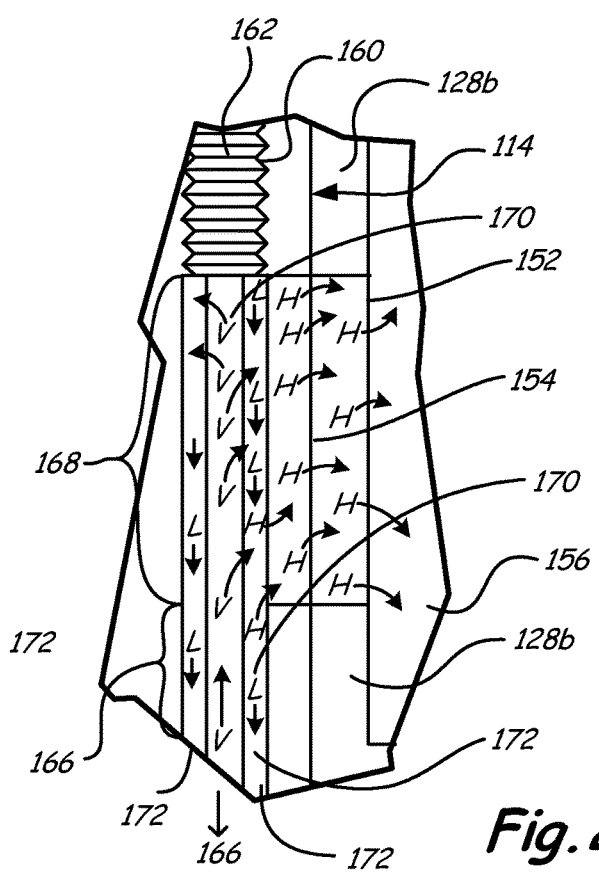

Pursuant to this embodiment, FIG. 2E illustrates the heat transport mechanism working to transfer heat from heat pipe 150 into thermoelectric generator assembly 126. FIG. 2E is a cross-section of heat dissipater cavity 168 (and connection portion of heat pipe 166) Like heat collector cavity 164, heat dissipater cavity 168 contains V phase working fluid 170 and is lined with wicking device 172, which contains L phase working fluid 170 (except for the small region comprising fill plug 162). Unlike heat collector cavity 164, working fluid 170 in heat dissipater cavity 168 is cooled by the operation of heat transfer device 127. In operation, V phase working fluid 170 in the interior of heat dissipater cavity 168 condenses onto the cooler surfaces of heat spreader 154, changes to L phase working fluid 170 and releases the heat of vaporization absorbed at heat collector cavity 164. The released heat H conducts into heat spreader 154 and through thermoelectric element 152 to heat transfer device 127. L phase working fluid 170 wets wicking device 172 and is driven out of heat dissipater cavity 168 into heat transport pipe 166 by capillary pressure in wicking device 172. Simultaneously, the condensation of V phase working fluid 170 in heat dissipater cavity 168 reduces the pressure in heat dissipater cavity 168, providing a pressure differential to drive more V phase working fluid 170 from heat transport pipe 166 into heat dissipater cavity 168. In this manner, heat flows efficiently from heat pipe 150 into thermoelectric generator assembly 126.

FIG. 2F illustrates one embodiment of a heat transport mechanism working to transfer heat collected from heat collector cavity 164, as illustrated in FIG. 2D, to heat dissipater cavity 168, as illustrated in FIG. 2E. FIG. 2F is a cross-section of a portion of heat transport pipe 166, which physically and thermally connects heat collector cavity 164 and heat dissipater cavity 168. Like heat collector cavity 164 and heat dissipater cavity 168, heat transport pipe 166 contains V phase working fluid 170 and is lined with wicking device 172, which contains L phase working fluid 170. Wicking device 172 in heat transport pipe 166 connects to wicking device 172 in heat collector cavity 164 and wicking device 172 in heat dissipater cavity 168 in a continuous fashion such that condensing L phase working fluid 170 from heat dissipater cavity 168 flows through heat transfer pipe 166 to heat collector cavity 164 driven by capillary pressure in wicking device 172. Depending on the mounting orientation of thermowell 114, the capillary pressure may work with or against the force of gravity. The capillary pressure in wicking device 172 must be sufficient to overcome the pressure differential between heat collector cavity 164 and heat dissipater cavity 168, in addition to the capillary pressure necessary to overcome the force of gravity, to drive a continuous source of L phase working fluid 170 to heat collector cavity 164. The interior of heat transfer pipe 166 connects to the interiors of heat collector cavity 164 and heat dissipater cavity 168 in a continuous fashion such that V phase working fluid 170 flows through the interior of heat transport pipe 166 from heat collector cavity 164 to heat dissipater cavity 168 driven by the pressure differential caused by the vaporization of L phase working fluid 170 in heat collector cavity 164 and the condensation of V phase working fluid 170 in heat dissipation cavity 168.

Pursuant to one embodiment, thermowell 114 is ideally assembled at a factory under precisely controlled conditions, ensuring consistent, reliable operation. This is in contrast to strapping or otherwise mounting a thermoelectric generator onto a vessel out in the field. Heat pipe 150 is preferably sealed under partial vacuum sufficient to maintain an internal pressure near the vapor pressure of working fluid 170 and to remove non-condensing gases, the presence of which would impede the flow of V phase working fluid 170 and reduce the efficiency of heat pipe 150. Working fluid 170 is loaded into heat pipe 150 through fill port 160 and sealed under partial vacuum with plug 162, as shown in FIG. 2A.

The embodiment of the present invention shown in FIGS. 2A-2F greatly improves the heat flux available for conversion by the thermoelectric generator by imbedding a heat pipe within a thermowell in direct contact with a process fluid. By penetrating the vessel wall directly, the problem of thermal resistance through the vessel wall is eliminated as is the need to achieve a good thermal connection between the thermoelectric generator and the vessel wall. Also, because the heat flows into heat pipe 150 from the entire surface area of heat collector cavity 164 and is transported by the heat of vaporization from the entire internal heat collector cavity surface, the heat transported by heat pipe 150 can be extremely high. Ultimately, the amount of heat transported is dependant on the area of heat collector cavity 164, the size and efficiency of heat transfer device 127, and the difference in temperature between ambient fluid A and process fluid F. Finally, because the entire unit can be assembled and tested under carefully controlled conditions at a factory, performance is more consistent and efficient.

The tubular heat collector cavity shape illustrated in FIGS. 2A-2F is one of many possible shapes employed depending on the process component and the amount of power to be generated. FIGS. 3A-3C illustrate another embodiment of the present invention incorporated into a thermowell for powering a wireless temperature measurement field device. In FIGS. 3A-3C, a cylindrical shaped heat collector cavity is combined with a thermoelectric generator assembly containing two thermoelectric elements. The larger heat collector cavity, with its increased surface area, supplies much greater heat flow than the embodiment of FIGS. 2A-2F. A significantly larger heat transfer device is also needed to support the greater heat flow. The greater heat flowing through the two thermoelectric elements produces significantly more power than the embodiment of FIGS. 2A-2F. The additional power is useful for wireless devices where, for example, more frequent transmissions are desired. The additional power is also useful for powering other elements of the wireless field device network, for example, a central controller, a gateway; a remote telemetry unit or a backhaul radio that connects a gateway to a higher-level network or host computer.

FIG. 3A shows a cross-section of another embodiment of the present invention incorporated into a thermowell for powering a wireless temperature measurement field device. Most of the components of the embodiment of FIG. 3A are identical to those described in reference to FIG. 2A-2F with reference numbers differing by 100. FIG. 3A shows process measurement point 210, including wireless field device 212, thermowell 214, process flange 216, flange bolts 218 and process piping 220 containing process fluid F. A heat sink is provided by ambient fluid A. Wireless field device 212 is identical to wireless field device 112 described above. Thermowell 214 is a flange-mounted process component comprising thermoelectric generator assembly 226, heat transfer device 227, insulation 228a, insulation 228b, thermowell cavity 248, and heat pipe 250. Thermoelectric generator assembly 226 comprises two thermoelectric elements 252, two heat spreaders 254, and two power cables 258. Thermoelectric elements 252 are identical to thermoelectric element 152 described above. As illustrated, heat transfer device 227 is identical to heat transfer device 127 described above, except that it completely encircles thermowell 214. Heat pipe 250 comprises two fill ports 260, two plugs 262, heat collector cavity 264, heat transport pipe 266, and two heat dissipater cavities 268. Heat pipe 250 also comprises a wicking device (not shown) and a working fluid present in both liquid and vapor phases (not shown); both wicking device and working fluid are as described above in reference to FIGS. 2D-2F. Employing two fill ports 260 on opposites of heat pipe 250 provides for more efficient loading of the working fluid. Heat collector cavity 264 is that portion of heat pipe 250 imbedded within the portion of thermowell 214 that is in direct contact with process fluid F. Heat dissipater cavities 268 are those portions of heat pipe 250 that are in direct contact with thermoelectric generator assembly 226. Heat transport pipe 266 is that portion of heat pipe 250 connecting heat collector cavity 264 to heat dissipater cavities 268. Connections and operations of the embodiment shown in FIG. 3A are as described above in reference to FIG. 2A, with component numbers increased by 100.

FIG. 3B is a cross-section of a portion of thermowell 214 that is in direct contact with process fluid F. As shown in FIG. 3B, heat collector cavity 264 has a cylindrical cross-section. The cylindrical shape of heat collector cavity 264 is efficiently created by manufacturing methods known in the art. In this embodiment, the cylindrical shape continues throughout heat pipe 250, with the exception of heat dissipater cavities 268.

FIG. 3C is a cross-section of a portion of thermowell 214 containing heat dissipater cavities 268. The cylindrical cross-section of heat transfer pipe 266 terminates at the junction with heat dissipater cavities 268. Heat dissipater cavities 268 are identical to heat dissipater cavity 168 described above. FIG. 3C further illustrates the shape of heat transfer device 227. Heat transfer device 227 wraps completely around the exterior of thermowell 214. As with embodiments described above, insulation 228a fills the gap between the portions of heat transfer device 227 that extend beyond thermoelectric elements 252 and the exterior of thermowell 214. Insulation 228a extends beyond the edges of heat transfer device 227 to insure good thermal isolation from the exterior surfaces of thermowell 214.

The embodiment of the present invention shown in FIGS. 3A-3C greatly improves the heat flux available for conversion by the thermoelectric generator by imbedding a heat pipe within a thermowell in direct contact with a process fluid. This embodiment, in addition to all of the advantages described for embodiments above, is able to produce significantly more power by increasing the size of both the heat pipe and the thermoelectric generator assembly. Although the embodiment is shown with two thermoelectric elements, it is understood that additional thermoelectric elements can be added to produce additional power, so long as sufficient heat flow is produced.

Figure 4A:
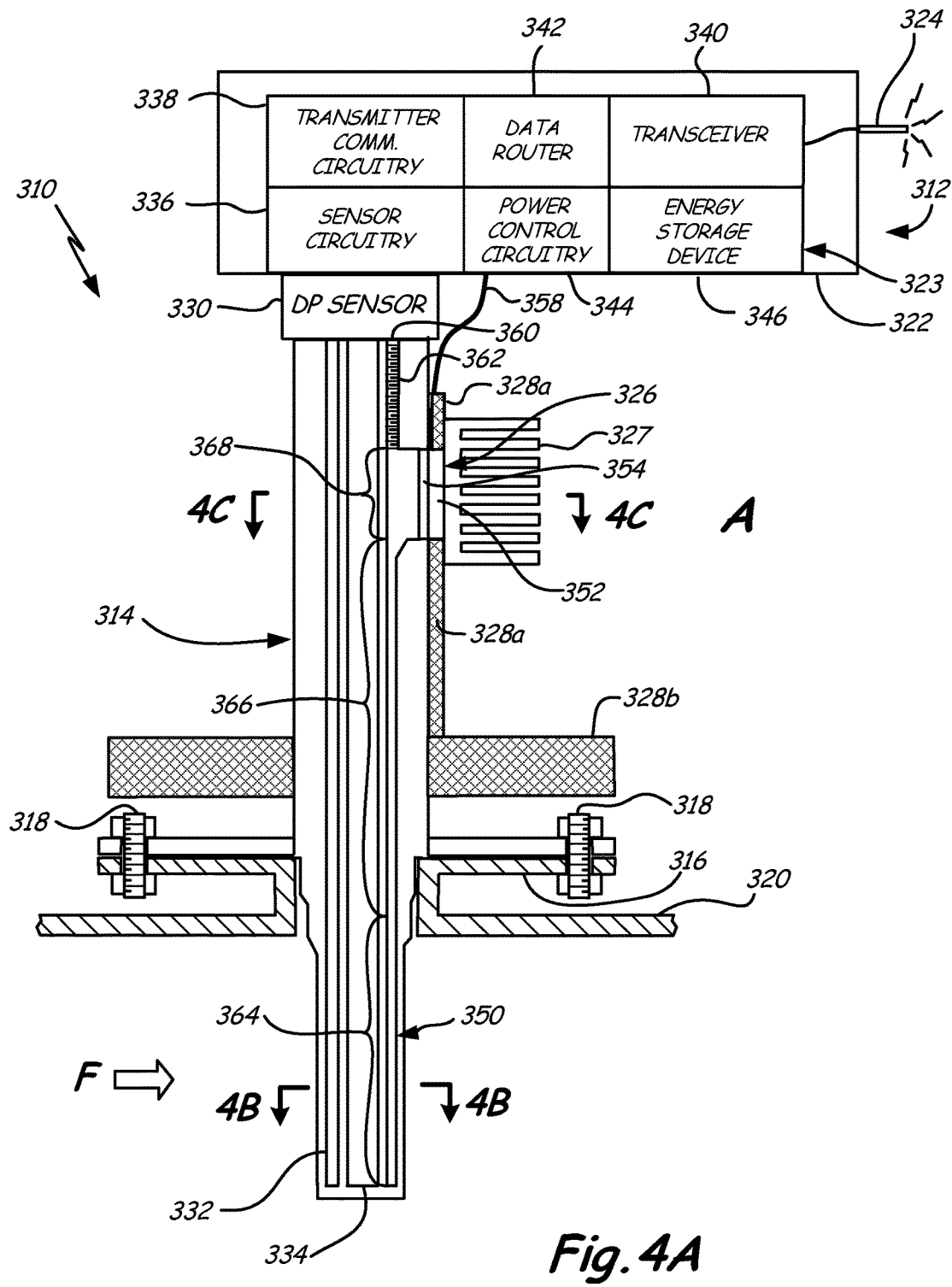
FIGS. 4A-4C illustrate an embodiment of the present invention incorporated into an averaging pitot tube for powering a wireless flow measurement field device.
Figure 4B:
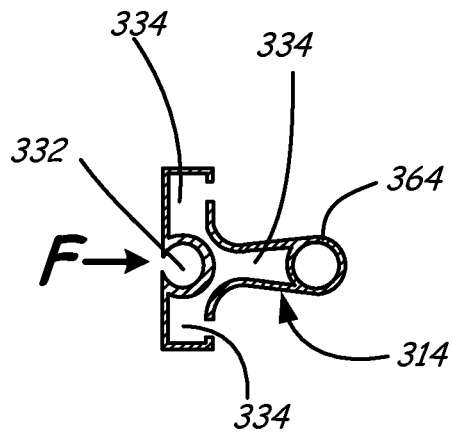
Figure 4C:
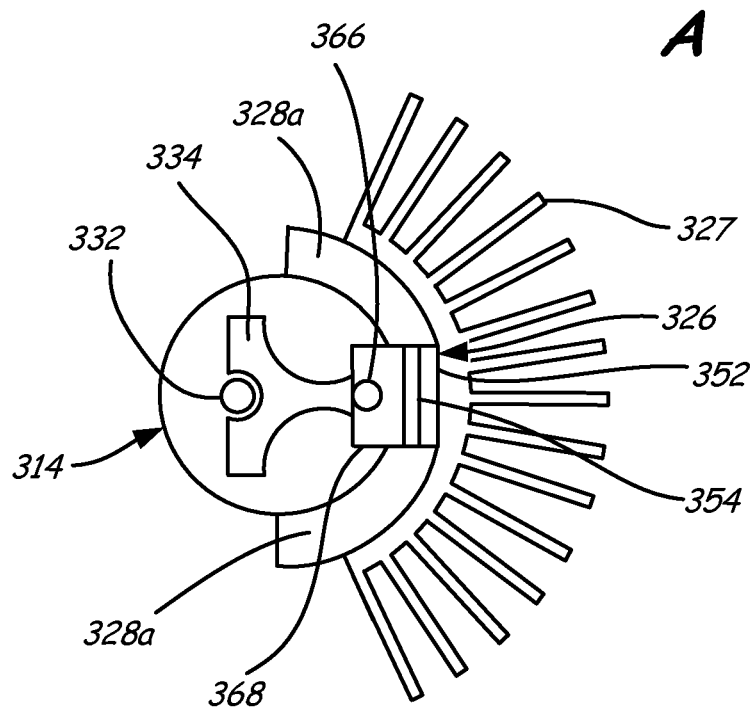

As mentioned above, wireless field devices like that described in FIG. 1 can measure any of a number of process characteristics such as, for example, pressure, flow velocity, mass flow, pH, temperature, density, and conductivity; or can monitor process equipment for such things as vibration, strain, or corrosion; or can monitor a general plant environment for such things as fire and gas detection; or can locate the present position of workers and equipment. FIGS. 4A-4C illustrate an embodiment of the present invention for powering a wireless device in a wireless field device mesh network with a thermoelectric generator incorporated into a process component, where the process component is an averaging pitot tube and the wireless device is a wireless flow measurement field device. An averaging pitot tube such as, for example, the ROSEMOUNT® 485 Annubar pitot tube, measures flow velocity by sensing ram (high) and static (low) pressures caused by the fluid flowing past the pitot tube. Increasing flow velocity produces a larger difference between the two pressures. The two pressures transmit through ports and plenums in the pitot tube to a differential pressure sensor which directly measures the difference between the two pressures.

FIG. 4A shows a cross-section of an averaging pitot tube incorporating one embodiment of the present invention. FIG. 4A shows process measurement point 310, including wireless field device 312, averaging pitot tube 314, process flange 316, flange bolts 318 and process piping 320 containing process fluid F. A heat sink is provided by ambient fluid A. Ambient fluid A surrounds process measurement point 310 and is typically air. Although process piping 320 is illustrated as a pipe as in FIG. 1, it may also be any of a number of process vessels including a process tank, storage tank, heat exchanger, boiler, distillation column, kiln, or reactor. Wireless field device 312 comprises electronics housing 322, electronics circuitry 323, antenna 324, and differential pressure (DP) sensor 330. DP sensor 330 is any sensor or sensors that vary an electrical characteristic in response to changes in the difference between two simultaneously sensed pressures such as, for example, the ROSEMOUNT® 30515 pressure transmitter. Electronics circuitry 323 comprises sensor circuitry 336, transmitter communication circuitry 338, transceiver 340, data router 342, power control circuitry 344, and energy storage device 346. Sensor circuitry 336 processes sensor signals and provides sensor excitation as is known in the art. Transmitter communication circuitry 338 comprises communication circuitry for sending and receiving wired signals. Transceiver 340 is a device for transmitting and receiving RF-based communication data. Data router 342 is a device that routes data packets. Power control circuitry 344 receives incoming power and conditions it as necessary for use by the other components of electronics circuitry 323. Energy storage device 346 stores energy for use by the other components of electronics circuitry 323 and is, for example, a primary battery, a rechargeable battery, a supercapacitor, or an energy storage capacitor as is known in the art. Averaging pitot tube 314 is a flange-mounted process component comprising thermoelectric generator assembly 326, heat transfer device 327, insulation 328a, insulation 328b, high pressure plenum 332, low pressure plenum 334, and heat pipe 350. Thermoelectric generator assembly 326 comprises thermoelectric element 352, heat spreader 354, and power cable 358. Thermoelectric element 352 is a device that produces voltage across the device and an electric current through the device (when connected to an electrical load) when opposite sides of the device are held at different temperatures, for example, a semiconductor-based device of a type known in the art made of a series of alternating n-type and p-type semiconductors. Heat spreader 354 is a block of high thermal conductivity material, for example, copper, employed to even out the heat flux over the surface of thermoelectric element 352. Heat transfer device 327 is any device for efficiently exchanging heat with ambient fluid A. As illustrated, heat transfer device 327 is a pin-fin heat exchanger made of a high thermal conductivity material, for example, copper, and is designed with large ratio of surface area to volume to enhance the transfer of heat. Insulation 328a and insulation 328b are any type of durable, thermally insulating structure compatible with ambient fluid A. Heat pipe 350 comprises fill port 360, plug 362, heat collector cavity 364, heat transport pipe 366, and heat dissipater cavity 368. Heat collector cavity 364 is that portion of heat pipe 350 imbedded within the portion of averaging pitot tube 314 that is in direct contact with process fluid F. Heat dissipater cavity 368 is that portion of heat pipe 350 that is in direct contact with thermoelectric generator assembly 326. Heat transport pipe 366 is that portion of heat pipe 350 connecting heat collector cavity 364 to heat dissipater cavity 368. Heat pipe 350 further comprises a wicking device (not shown) and a working fluid present in both liquid and vapor phases (not shown); both wicking device and working fluid are as described above in reference to FIGS. 2D-2F.

Process flange 316 is attached (generally welded) to an opening in process piping 320 to create a port into process piping 320. A sealing gasket (not shown) is inserted between the mating surfaces of averaging pitot tube 314 and process flange 316 before averaging pitot tube 314 is inserted into the port to be in direct contact with process fluid F when it flows through process piping 320 as shown in FIG. 4A. Averaging pitot tube 314 connects to process flange 316 at a flanged portion of averaging pitot tube 314 with a plurality of flange bolts 318 (typically four or more, two shown). DP sensor 330 is attached to averaging pitot tube 314 such that a pressure in high pressure plenum 332 and a pressure in low pressure plenum 334 are simultaneously sensed by DP sensor 330. DP sensor 330 connects to electronics circuitry 323 within electronics housing 322 at sensor circuitry 336. Antenna 324 connects to electronics circuitry 323 within electronics housing 322 at transceiver 340. Within electronics circuitry 323, sensor circuitry 336 connects to transmitter communication circuitry 338. Transmitter communication circuitry 338 connects to data router 342 which connects to transceiver 340. Power control circuitry 344 connects to energy storage device 346, sensor circuitry 336, transmitter communication circuitry 338, data router 342, and transceiver 340. Heat pipe 350 extends from heat collector cavity 364 to heat dissipater cavity 368 with heat transport pipe 366 connecting heat collector cavity 364 to heat dissipater cavity 368. Plug 362 seals off fill port 360 after the working fluid is loaded into heat pipe 350 under partial vacuum. Heat dissipater cavity 368 of heat pipe 350 connects to thermoelectric generator assembly 326 at heat spreader 354. Heat spreader 354 is intimately attached to one side of thermoelectric element 352 and heat transfer device 327 is intimately attached to the other side of thermoelectric element 352, opposite heat spreader 354. Power cable 358 connects thermoelectric element 352 to electronics circuitry 323 within electronics housing 322 at power control circuitry 344. Insulation 328a is positioned in a gap between heat transfer device 327 and the external surface of averaging pitot tube 314, with insulation 328a extending beyond the edges of heat transfer device 327 to insure good thermal isolation. Likewise, insulation 328b is positioned in the space between heat transfer device 327 and the flanged portion of averaging pitot tube 314 attached to process flange 316.

In operation, DP sensor 330 varies an electrical characteristic in response to changes in the difference between a pressure in high pressure plenum 332 and a pressure in low pressure plenum 334, the two pressures resulting from the flow of process fluid F past averaging pitot tube 314 as conducted by separate ports in the pitot tube to high pressure plenum 332 and low pressure plenum 334. The variation in electrical characteristic is translated by sensor circuitry 336 into a flow measurement. Sensor circuitry 336 sends the flow measurement to transmitter communication circuitry 338 which sends the flow measurement and any additional information (e.g., wireless field device ID) over a wired link (not shown) to data router 342. Data router 342 formats the information into a digital data packet along with information on a transmission destination and sends the digital data packet to transceiver 340 for transmission into a wireless field device mesh network via antenna 324.

In addition, as a member of the wireless field device mesh network, wireless field device 312 routes data packets received from the wireless field device mesh network. Transceiver 340 receives digital data packets from the wireless field device mesh network via antenna 324 and sends the digital data packets to data router 342. Data router 342 routes the data packets received by transceiver 340, unpacking the communication payload for consumption by transmitter communication circuitry 338, if the device address of wireless field device 312 matches the final destination address in the packet, or redirecting the digital data packets back to transceiver 340 to be relayed back into the network via antenna 324 to the next destination in the logical path.

At least a portion of the power for the flow measurement and data transmission described above is supplied in the embodiment of the present invention by the operation of thermoelectric generator assembly 326 with a heat flow efficiently supplied by heat pipe 350. Heat collector cavity 364 collects heat from process fluid F. Heat transport pipe 366 transfers the heat from heat collector cavity 364 to heat dissipater cavity 368. At heat dissipater cavity 368, heat is transferred into heat spreader 354, which evens out the heat flux as the heat flow conducts through heat spreader 354 to thermoelectric element 352. As the heat flows through thermoelectric element 352 a voltage and a current are generated as a function of the amount of heat flowing through thermoelectric element 352. The generation of both a voltage and a current produce power which is consumed by wireless field device 312 as needed. Heat transfer device 327, with its large surface area, efficiently removes heat from the side of thermoelectric element 352 opposite heat spreader 354 by conduction to ambient fluid A. Ambient fluid A, through convection, conduction or a combination of the two, absorbs or carries away the heat, thus maintaining the steady heat flow through thermoelectric element 352 necessary for continuous power production. Insulation 328a and insulation 328b reduce heat entering heat transfer device 327 from sources other than thermoelectric element 352 by insulating areas likely to be at a temperature between process fluid F and ambient fluid A, such as exterior surfaces of averaging pitot tube 314. This improves the efficiency of thermoelectric generator assembly 326 by limiting the heat to be removed by heat transfer device 327 to the heat flowing through thermoelectric element 352. Power produced by thermoelectric element 352 is conducted by power cable 358 to power control circuitry 344. Power control circuitry 344 conditions the power and distributes it as needed to sensor circuitry 336, transmitter communication circuitry 338, data router 342, and transceiver 340 for the flow measurement and data transmission operations described above. Optionally, power in excess of the immediate requirements for flow measurement and data transmission operations is stored in energy storage device 346. Power stored in energy storage device 346 is tapped by power control circuitry 344 when flow measurement and data transmission operation requirements exceed the power immediately available from thermoelectric generator assembly 326, for example, during process start up or shut down when the temperature of process fluid F is lower than during normal process operation.

FIG. 4B is a cross-section of a portion of averaging pitot tube 314 that is in direct contact with process fluid F. High pressure plenum 332 opens to ram (high) pressure, low pressure plenum 334 opens to static (low) pressure, and heat collector cavity 364 has a closed circular cross-section. In this embodiment, the tubular shape of heat collector cavity 364 continues throughout heat pipe 350, with the exception of heat dissipater cavity 368.

FIG. 4C illustrates the shape of heat dissipater cavity 368 according to this embodiment. The circular cross-section of heat transfer pipe 366 terminates at the edge of heat dissipater cavity 368. Heat dissipater cavity 368 is a rectangular cavity matching the rectangular shape of heat spreader 354. This shape is also efficiently created by manufacturing methods know in the art. Heat dissipater cavity 368 is comprised of interior surfaces of averaging pitot tube 314 on five of six sides and of heat spreader 354 on the remaining side. FIG. 4C further illustrates the shape of heat transfer device 327. Heat transfer device 327 wraps partially around the exterior of averaging pitot tube 314 to increase the surface area of heat transfer device 327. As mentioned above, insulation 328a fills the gap between the portions of heat transfer device 327 that extend beyond thermoelectric element 352 and the exterior of averaging pitot tube 314. Insulation 328a extends beyond the edges of heat transfer device 327 in all directions to insure good thermal isolation from the exterior surfaces of averaging pitot tube 314, which are at a temperature between that of process fluid F and ambient fluid A.

The embodiment of the present invention shown in FIGS. 4A-4C greatly improves the heat flux available for conversion by the thermoelectric generator by imbedding a heat pipe within an averaging pitot tube in direct contact with a process fluid. By penetrating the vessel wall directly, the problem of thermal resistance through the vessel wall is eliminated as is the need to achieve a good thermal connection between the thermoelectric generator and the vessel wall. Also, because the heat flows into heat pipe 350 from the entire surface area of heat collector cavity 364 and is transported by the heat of vaporization from the entire internal heat collector cavity surface, heat can be very efficiently transported by heat pipe 350.

The embodiments of the present invention described above comprise process components connected to a vessel by a process flange. Alternative embodiments of the present invention connect to a vessel by other than a process flange, for example, a threaded connection or a welded connection.

FIGS. 5A-5F illustrate yet another embodiment of the present invention for powering a wireless device in a wireless field device mesh network with a thermoelectric generator incorporated into a process component, where the process component is an orifice plate flange and the wireless device is a wireless flow measurement field device. In contrast to the embodiments described above, this embodiment replaces a section of process piping through which a process fluid (or process fluid by-product) flows, instead of attaching to an external opening in a process vessel. Orifice plate flanges such as those found in, for example, a ROSEMOUNT® 1496 flange union, include pressure taps for transmitting fluid pressure to a DP sensor. Two such orifice plate flanges comprise the flange union, with each orifice plate flange employing a pressure tap to transmit the fluid pressure in the pipe to the DP sensor via an impulse line. An orifice plate, for example, a ROSEMOUNT® 1495 orifice plate, positioned between the two orifice plate flanges causes a pressure drop across the orifice plate as the fluid is forced to flow through the orifice, resulting in two different fluid pressures being transmitted to the DP sensor. This pressure difference is a function of flow velocity through the pipe. An increase in flow velocity produces a larger difference between the two pressures. The two pressures transmit through the pressure taps and impulse lines to the DP sensor which directly measures the difference between the two pressures.

Figure 5A:
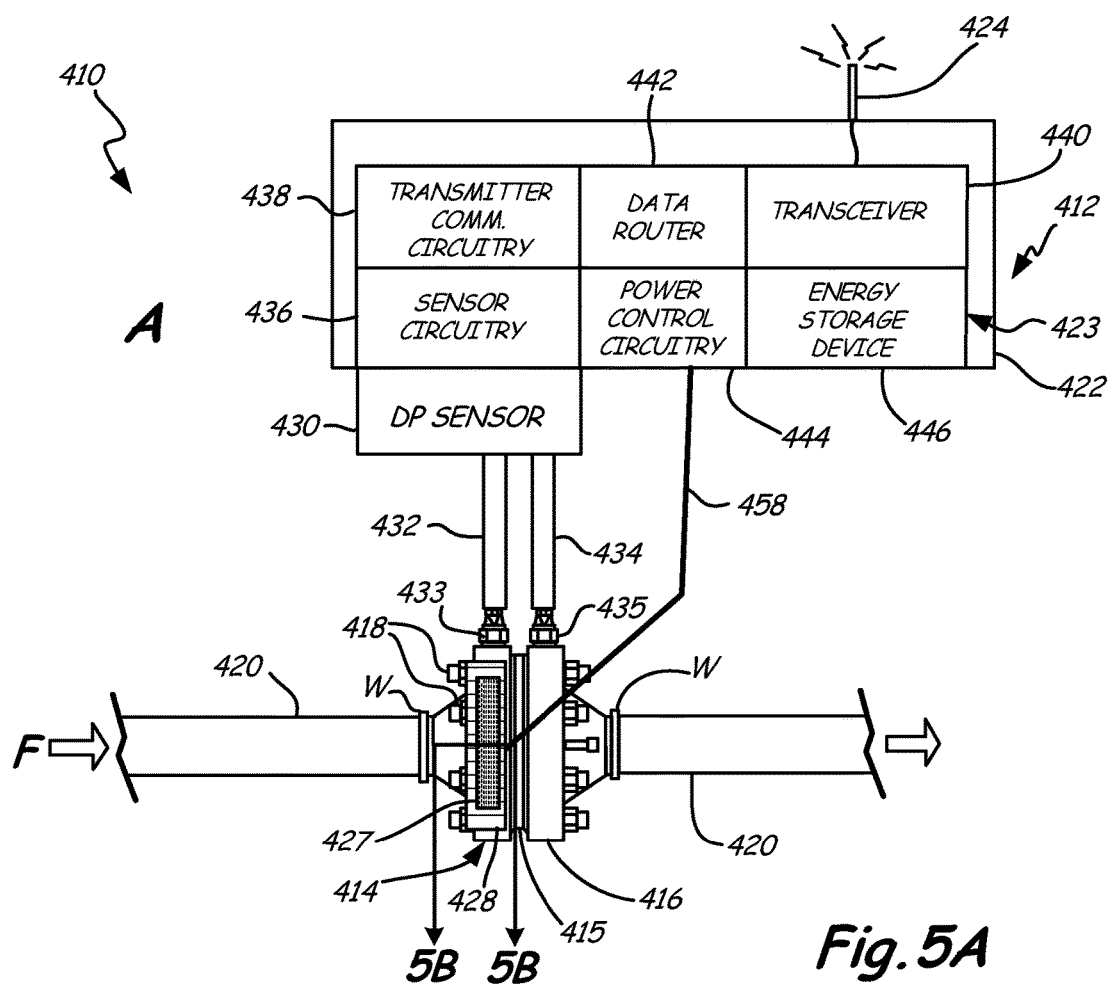

FIG. 5A illustrates one embodiment of a process component incorporating the present invention where the process component is an orifice plate flange. FIG. 5A shows process measurement or control point 410, including wireless flow measurement field device 412, orifice plate flange 414, orifice plate 415, orifice plate flange 416, stud/nuts 418 and process piping 420 containing process fluid F. A heat sink is provided by ambient fluid A. Ambient fluid A surrounds process measurement point 410 and is typically air. Wireless flow measurement field device 412 comprises electronics housing 422, electronics circuitry 423, antenna 424, differential pressure (DP) sensor 430, high-side (upstream) impulse line 432, and low-side (downstream) impulse line 434. Impulse line 432 and impulse line 434 are typically metal pipes chemically compatible with process fluid F, for example, stainless steel. Electronics circuitry 423 is as described above in reference to FIG. 4A with reference numbers increased by 100. Orifice plate flange 414 is an in-line process component comprising high-side pressure tap 433, thermoelectric generator assembly 426 (shown in FIG. 5B), heat transfer device 427, insulation 428, and heat pipe 450 (shown in FIG. 5B). Thermoelectric generator assembly 426 comprises power cable 458. Orifice plate flange 416 is an in-line process component comprising low-side pressure tap 435. Together, orifice plate flange 414, orifice plate 415, orifice plate flange 416, studs/nuts 418, and sealing gaskets (not shown) comprise an orifice plate flange union.

Orifice plate flange 414 and orifice plate flange 416 are attached to process piping 420 at points W by, for example, welding. Orifice plate 415 is inserted between orifice plate flange 414 and orifice plate flange 416 with a first sealing gasket between orifice plate 415 and orifice plate flange 414 and a second sealing gasket between orifice plate 415 and orifice plate flange 416. Orifice plate flange 414, orifice plate 415, orifice plate flange 416, and the two gaskets are bolted together by a plurality of stud/nuts 418. Thermoelectric generator assembly 426 is integrated with orifice plate flange 414 and is in thermal contact with process fluid F and ambient fluid A. Insulation 428 is positioned to thermally shield heat transfer device 427 in thermal contact with fluid A from portions of orifice plate flange 414 in thermal contact with process fluid F. Impulse line 432 connects to orifice plate flange 414 at pressure tap 433 by, for example, a threaded connection. Similarly, impulse line 434 connects to pressure tap 435. Impulse line 432 and impulse line 434 connect pressure tap 433 and pressure tap 435, respectively, to DP sensor 430, physically connecting wireless flow measurement field device 412 to orifice plate flange 414 and orifice plate flange 416, respectively. DP sensor 430 connects to electronics circuitry 423 within electronics housing 422 at sensor circuitry 436. Connections within electronics housing 422 are as described above with respect to FIG. 4A.

In operation, high-side impulse line 432 and low-side impulse line 434 transmit process pressures to DP sensor 430. DP sensor 430 varies an electrical characteristic in response to changes in the difference between the pressure in high-side impulse line 432 and the pressure in low-side impulse line 434, the two pressures resulting from the restricted flow of process fluid F through the orifice plate. The variation in electrical characteristic is translated by sensor circuitry 436 into a flow measurement.

At least a portion of power for the flow measurement and data transmission described above is supplied to wireless flow measurement field device 412 in the embodiment of the present invention by the operation of thermoelectric generator assembly 426 with a heat flow efficiently supplied by heat pipe 450 as described above in reference to FIG. 4A with reference numbers increased by 100 and illustrated in FIGS. 5B-5F. A heat flow driven by the temperature difference between process fluid F and ambient fluid A is transported by heat pipe 450 in orifice plate flange 414. The heat flow is conducted through thermoelectric generator assembly 426 by the dissipation of the heat into ambient fluid A by heat transfer device 427, generating electrical power.

Figure 5B:
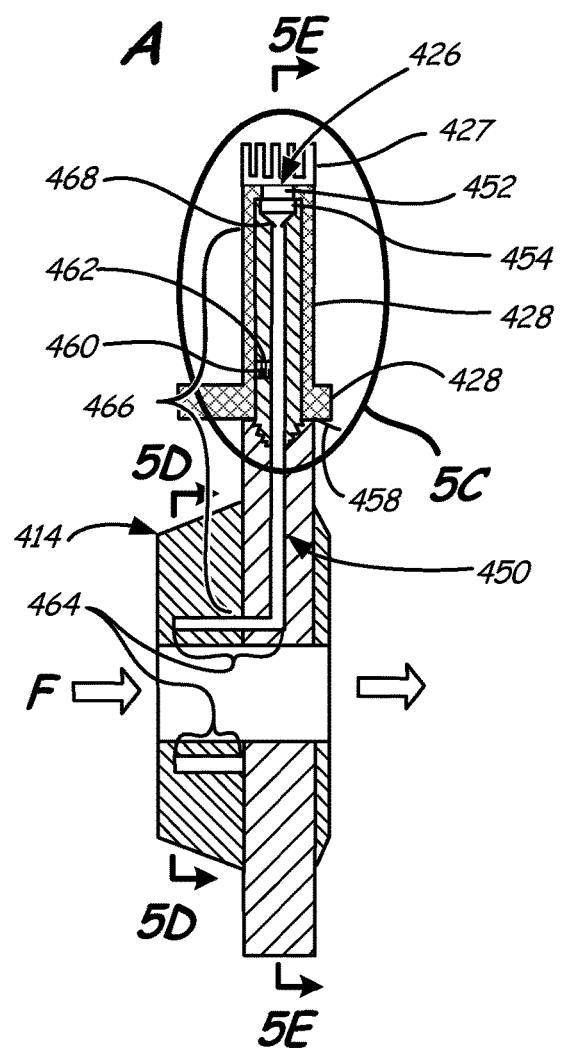
Figure 5C:
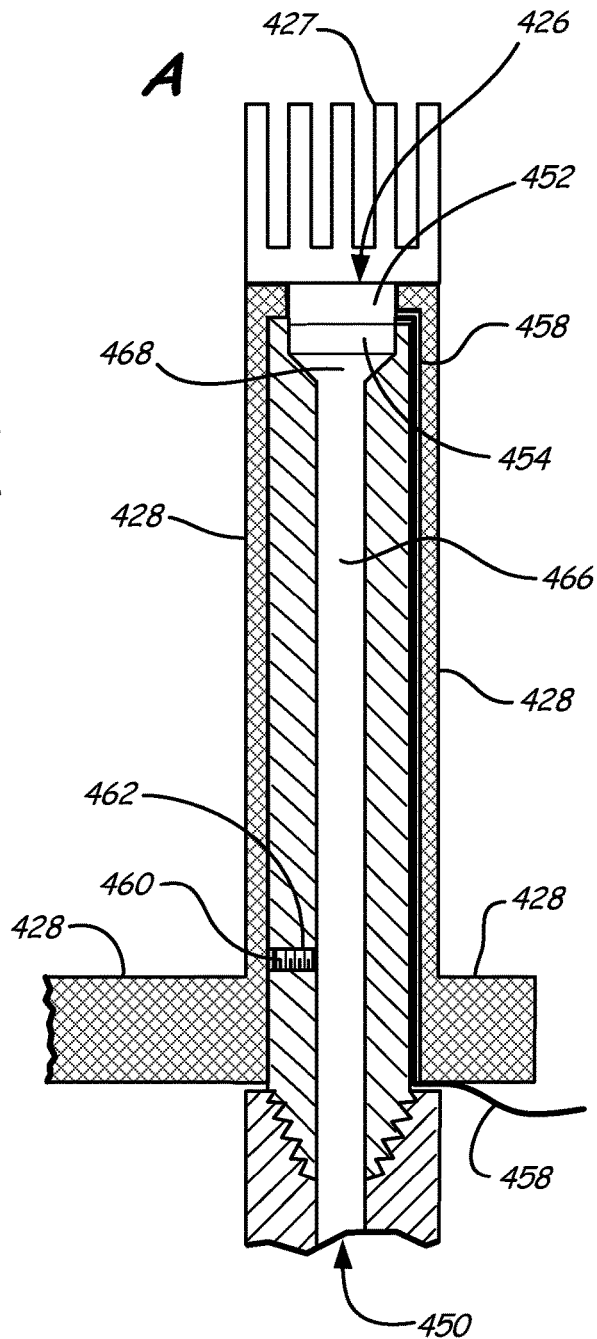

FIG. 5B is a cross-section of orifice plate flange 414 illustrating thermoelectric generator assembly 426, heat transfer device 427, insulation 428, and heat pipe 450. FIG. 5C is a portion of FIG. 5B enlarged to better illustrate the details of thermoelectric generator assembly 426, heat transfer device 427, insulation 428, and a portion of heat pipe 450. FIG. 5C shows primarily an extended portion of orifice plate flange 414 attached to the main, flange portion of orifice plate flange 414 by, for example, a threaded connection (as shown) or a welded connection. The extended portion of orifice plate flange 414 serves to provide spatial separation for improved thermal isolation, in addition to the thermal shielding of insulation 428, between heat transfer device 427 in thermal contact with fluid A and portions of orifice plate flange 414 in thermal contact with process fluid F. As illustrated, heat transfer device 427 is a pin-fin heat exchanger made of a high thermal conductivity material, for example, copper, and is designed with large ratio of surface area to volume to enhance the transfer of heat.

As shown in FIGS. 5B-5C, thermoelectric generator assembly 426 comprises thermoelectric element 452, heat spreader 454, and power cable 458. Thermoelectric element 452 and heat spreader 454 are as described in reference to FIG. 4A, with reference numbers differing by 100. Heat pipe 450 comprises fill port 460, plug 462, heat collector cavity 464, heat transport pipe 466, and heat dissipater cavity 468. Heat collector cavity 464 is that portion of heat pipe 450 imbedded within the portion of orifice plate flange 414 that is in direct contact with process fluid F. Heat dissipater cavity 468 is that portion of heat pipe 450 that is in direct contact with thermoelectric generator assembly 426. Heat transport pipe 466 is that portion of heat pipe 450 connecting heat collector cavity 464 to heat dissipater cavity 468. Heat pipe 450 further comprises a wicking device (not shown) and a working fluid present in both liquid and vapor phases (not shown); both wicking device and working fluid are as described above in reference to FIGS. 2D-2F.

Heat pipe 450 extends from heat collector cavity 464 to heat dissipater cavity 468 with heat transport pipe 466 connecting heat collector cavity 464 to heat dissipater cavity 468. Heat dissipater cavity 468 of heat pipe 450 connects to thermoelectric generator assembly 426 at heat spreader 454. Heat spreader 454 is intimately attached to one side of thermoelectric element 452 and heat transfer device 427 is intimately attached to the other side of thermoelectric element 452, opposite heat spreader 454. Power cable 458 connects thermoelectric element 452 to electronics circuitry 423 within electronics housing 422 at power control circuitry 444 (shown in FIG. 5A). Insulation 428 is positioned in a gap between heat transfer device 427 and the external surface of orifice plate flange 414, extending beyond the edges of heat transfer device 427 to insure good thermal isolation between heat transfer device 427 and the flange portion of orifice plate flange 414.

As illustrated in FIG. 5B, heat collector cavity 464 extends along much of a portion of orifice plate flange 414 that is proximate process fluid F. FIG. 5D is a cross-section of orifice plate flange 414 showing the cylindrical shape of heat collector cavity 464. This shape surrounds process fluid F and provides a large surface area for heat transfer from process fluid F into heat pipe 450.

FIG. 5E is another cross-section of orifice plate flange 414. FIG. 5E illustrates orifice plate flange 414 rotated 90 degrees from FIG. 5B. In addition to the identically numbered elements in FIG. 5B, FIG. 5E shows high side pressure tap 433 and plurality of bolt holes 474. Heat transfer device 427 extends significantly beyond thermoelectric element 452 to provide a large ratio of surface area to volume to enhance the transfer of heat with ambient fluid A. Insulation 428 is positioned in the gap between heat transfer device 427 and the external surface of orifice plate flange 414, extending well beyond the edges of heat transfer device 427 to insure good thermal isolation between heat transfer device 427 and both the flange and extended portions of orifice plate flange 414.

FIG. 5F is another cross-section of orifice plate flange 414 in an axial plane 90 degrees from FIG. 5B. FIG. 5F shows high side pressure tap 433 and heat collector cavity 464 of heat pipe 450. As shown in FIGS. 5B, and 5E-5F, heat pipe 450 is completely separate from, and does not interfere with the functioning of, high side pressure tap 433.

Although the embodiment of FIG. 5A is described with orifice plate flange 414 positioned in the upstream location, it is understood that an orifice plate flange incorporating the present invention functions as well when alternatively positioned in the downstream location. In addition, although the embodiment of FIG. 5A shows only orifice plate flange 414 incorporating the present invention to supply power to wireless flow measurement field device 412, it is understood that orifice plate flange 416 may also include the present invention in a fashion identical to orifice plate flange 414. Such an arrangement increases the power to wireless flow measurement field device 412 for applications requiring, for example, more frequent communications with the wireless field device mesh network. The additional power is also useful for powering other elements of the wireless field device network, for example, a central controller, a gateway; a remote telemetry unit or a backhaul radio that connects a gateway to a higher-level network or host computer.

The embodiment of the present invention shown in FIGS. 5A-5F greatly improves the heat flux available for conversion by the thermoelectric generator by imbedding a heat pipe within an orifice plate flange in direct contact with a process fluid. By penetrating the vessel wall directly, the problem of thermal resistance through the vessel wall is eliminated as is the need to achieve a good thermal connection between the thermoelectric generator and the vessel wall. Also, because the heat flows into heat pipe 450 from the entire surface area of heat collector cavity 464 and is transported by the heat of vaporization from the entire internal heat collector cavity surface, the heat flux transported by heat pipe 450 is extremely high.

Figure 6A:
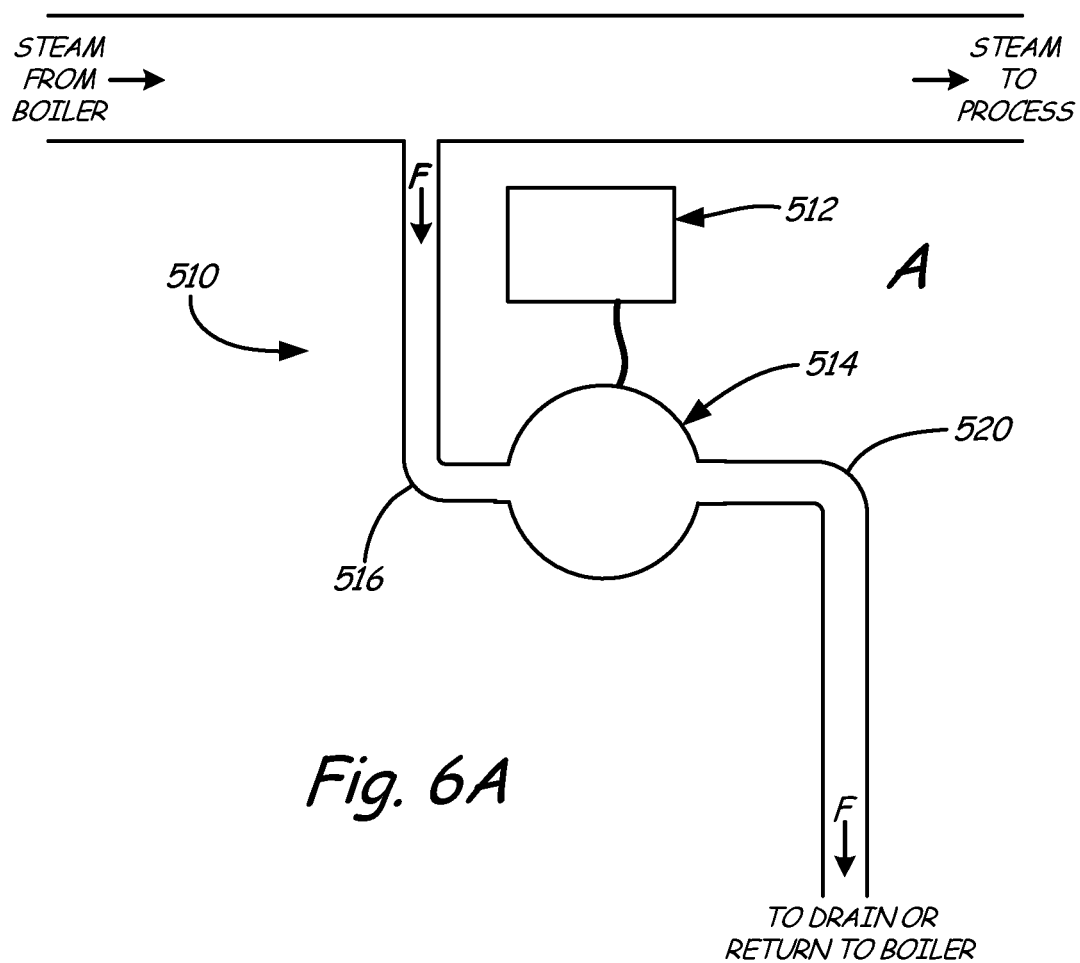
FIGS. 6A-6E illustrate an embodiment of the present invention incorporated into a steam trap for powering a wireless data router.

FIGS. 6A-6E illustrate yet another embodiment of the present invention for powering a wireless device in a wireless field device mesh network with a thermoelectric generator incorporated into a process component, where the process component is a steam trap and the wireless device is a wireless data router. Like the embodiment described in reference to FIGS. 5A-5D, this embodiment replaces a section of process piping through which a process fluid (or process fluid by-product) flows, instead of attaching to an external opening in a process vessel. FIG. 6A illustrates a process component incorporating the present invention where the process component is a steam trap. Steam trap 514 is attached to process piping carrying primarily steam, steam line 516, at measurement or control point 510. Measurement or control point 510 is a location where water condensing from the steam naturally collects. Measurement or control point 510 includes wireless data router 512. The condensate water is a process fluid by-product resulting from heat losses from steam line 516 into the ambient environment. Steam trap 514 contains a device that permits the condensate water to flow out of steam line 516 and into process piping for draining condensate water, condensate line 520, while controlling, and largely preventing, the escape of steam into condensate line 520.

Figure 6B:
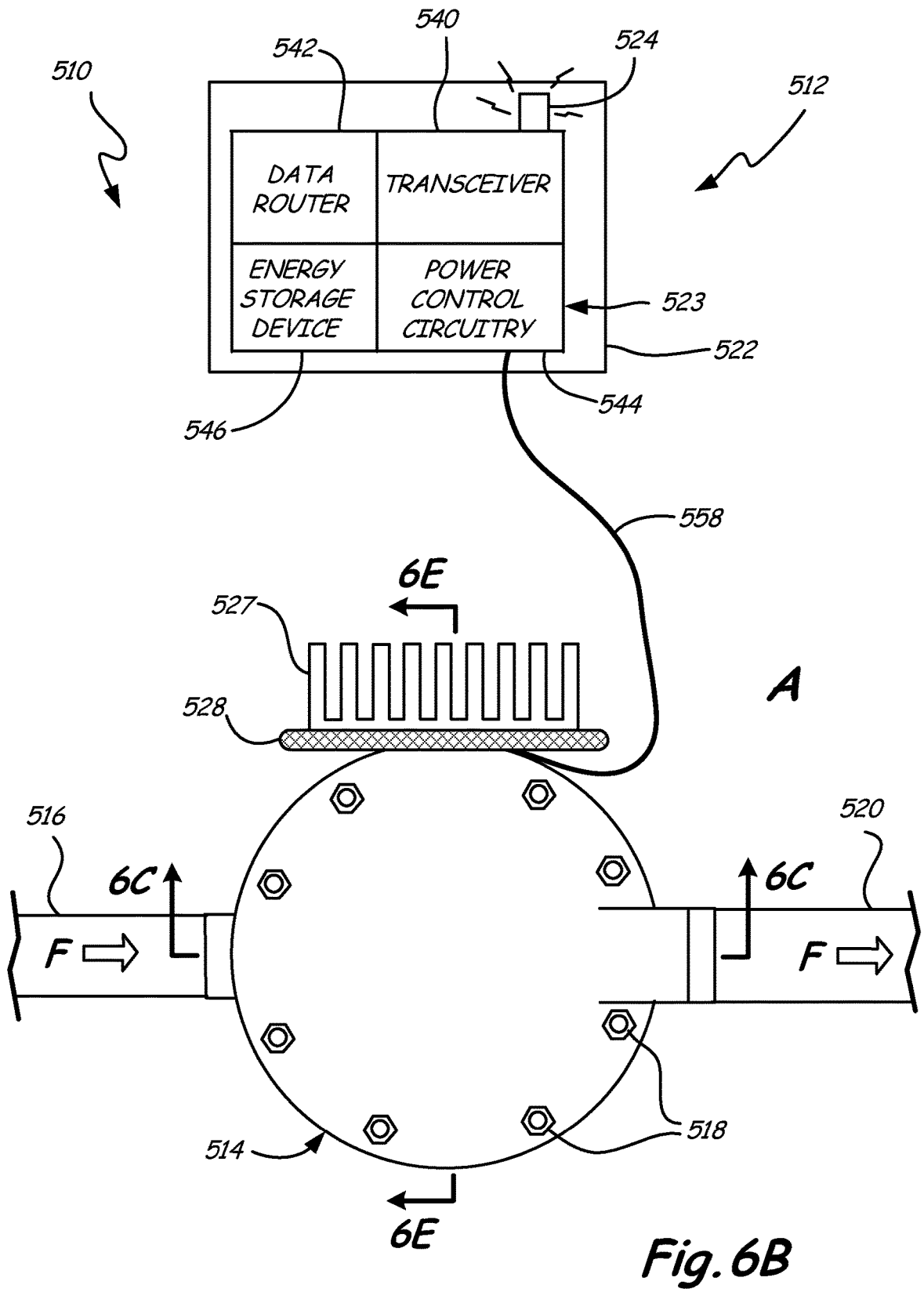

FIGS. 6B-6E illustrate how steam trap 514 shown in FIG. 6A embodies the present invention. FIG. 6B shows process measurement or control point 510, including wireless data router 512, steam trap 514, steam line 516 and condensate line 520. Wireless data router 512 comprises electronics housing 522, electronics circuitry 523, and antenna 524. Electronics circuitry 523 comprises transceiver 540, data router 542, power control circuitry 544, and energy storage device 546. Steam trap 514 comprises thermoelectric generator assembly 526 (shown in FIG. 6E), heat transfer device 527, insulation 528, steam trap bolts 518, and heat pipe 550 (shown in FIGS. 6C-6E). Thermoelectric generator assembly 526 comprises power cable 558. As illustrated, heat transfer device 527 is a pin-fin heat exchanger.

Steam trap 514 is attached by, for example, threaded connections, to steam line 516 and condensate line 520. Thermoelectric generator assembly 526 is integrated with steam trap 514 and is in thermal contact with steam/condensate F and ambient fluid A. Steam/condensate F is a mixture of steam and condensate. A heat sink is provided by ambient fluid A. Steam/condensate F and ambient fluid A are at different temperatures. Power cable 558 connects thermoelectric generator assembly 526 to electronics circuitry 523 within electronics housing 522 at power control circuitry 544.

In operation, steam trap 514 permits condensate water from steam line 516 to flow out of steam line 516 and into condensate line 520, as explained below in reference to FIG. 6C. Wireless data router 512 routes data packets received from a wireless field device mesh network. At least a portion of the power for this data transmission is supplied to wireless data router 512 in the embodiment of the present invention by the operation of thermoelectric generator assembly 526 with a heat flow efficiently supplied by heat pipe 550 as described in detail in FIGS. 6C-6E below. A heat flow driven by the temperature difference between steam/condensate F and ambient fluid A is transported by heat pipe 550 (shown in FIGS. 6C-6E) in steam trap 514. The heat flow is conducted through thermoelectric generator assembly 526 by the dissipation of the heat into ambient fluid A by heat transfer device 527, generating electrical power.

Figure 6C:
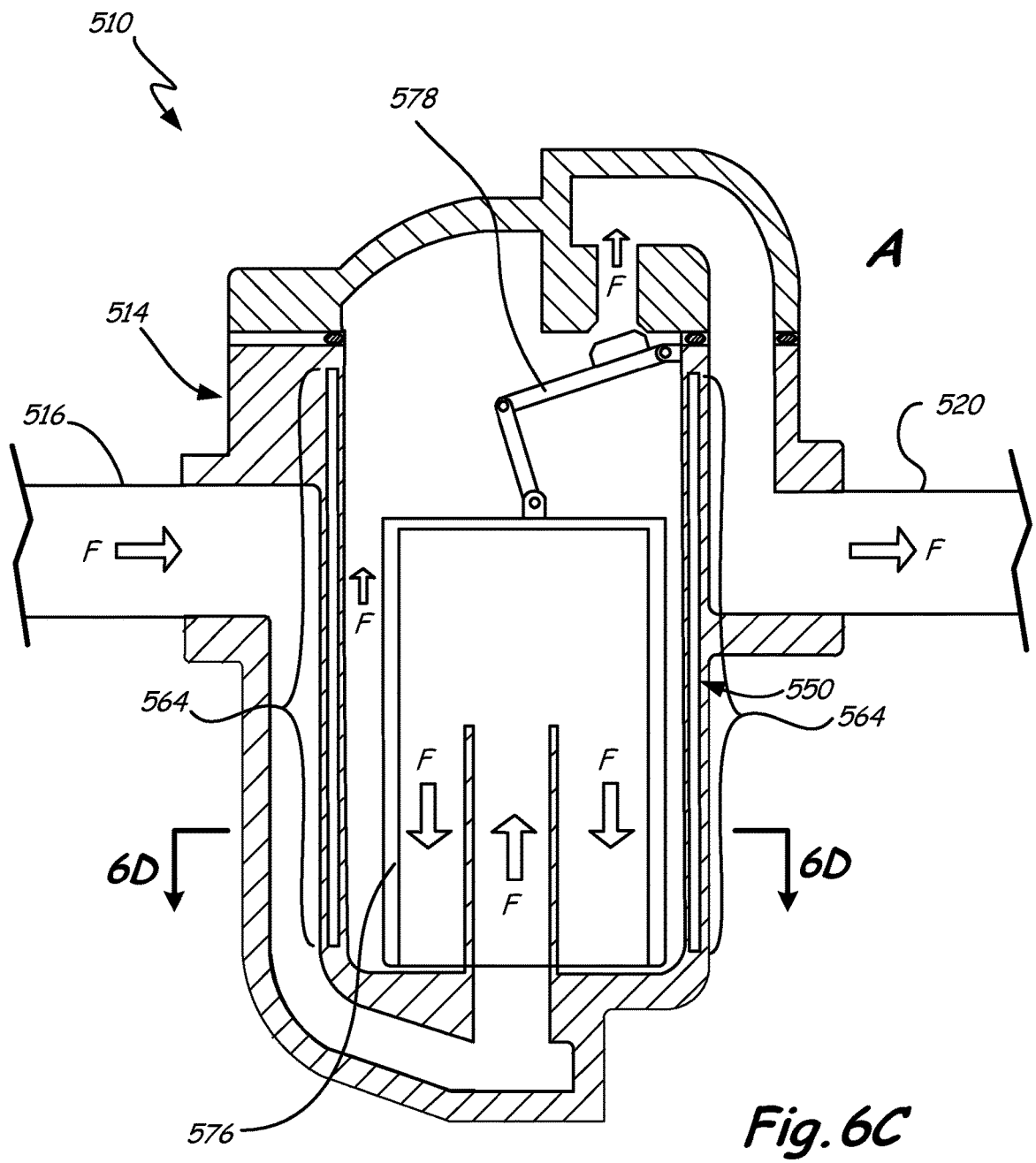
Figure 6D:
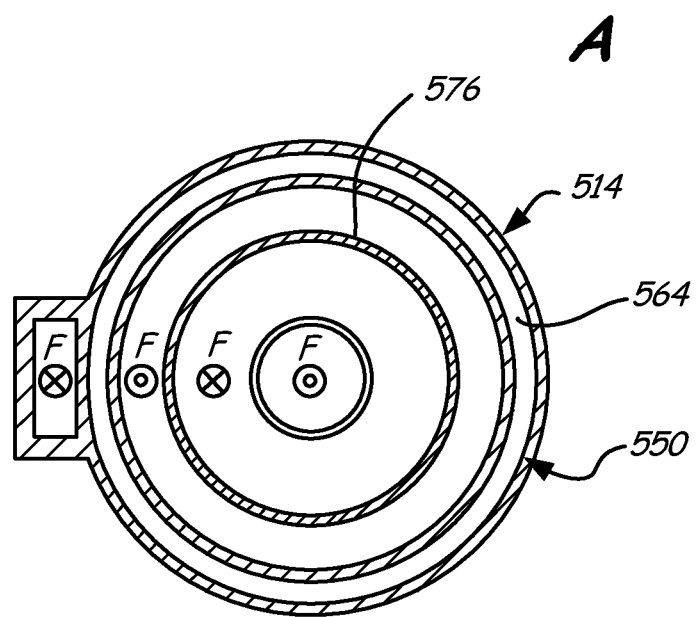

FIG. 6C is a cross-section of steam trap 514 illustrating a portion of heat pipe 550, heat collector cavity 564. As shown in FIG. 6C, heat collector cavity 564 lines the interior of steam trap 514 collecting heat from steam/condensate F. FIG. 6D is a cross-section of steam trap 514 showing the cylindrical shape of heat collector cavity 564. This shape surrounds steam/condensate F flowing through steam trap 514 and provides a large surface area for heat transfer from steam/condensate F into heat pipe 550.

Figure 6E:
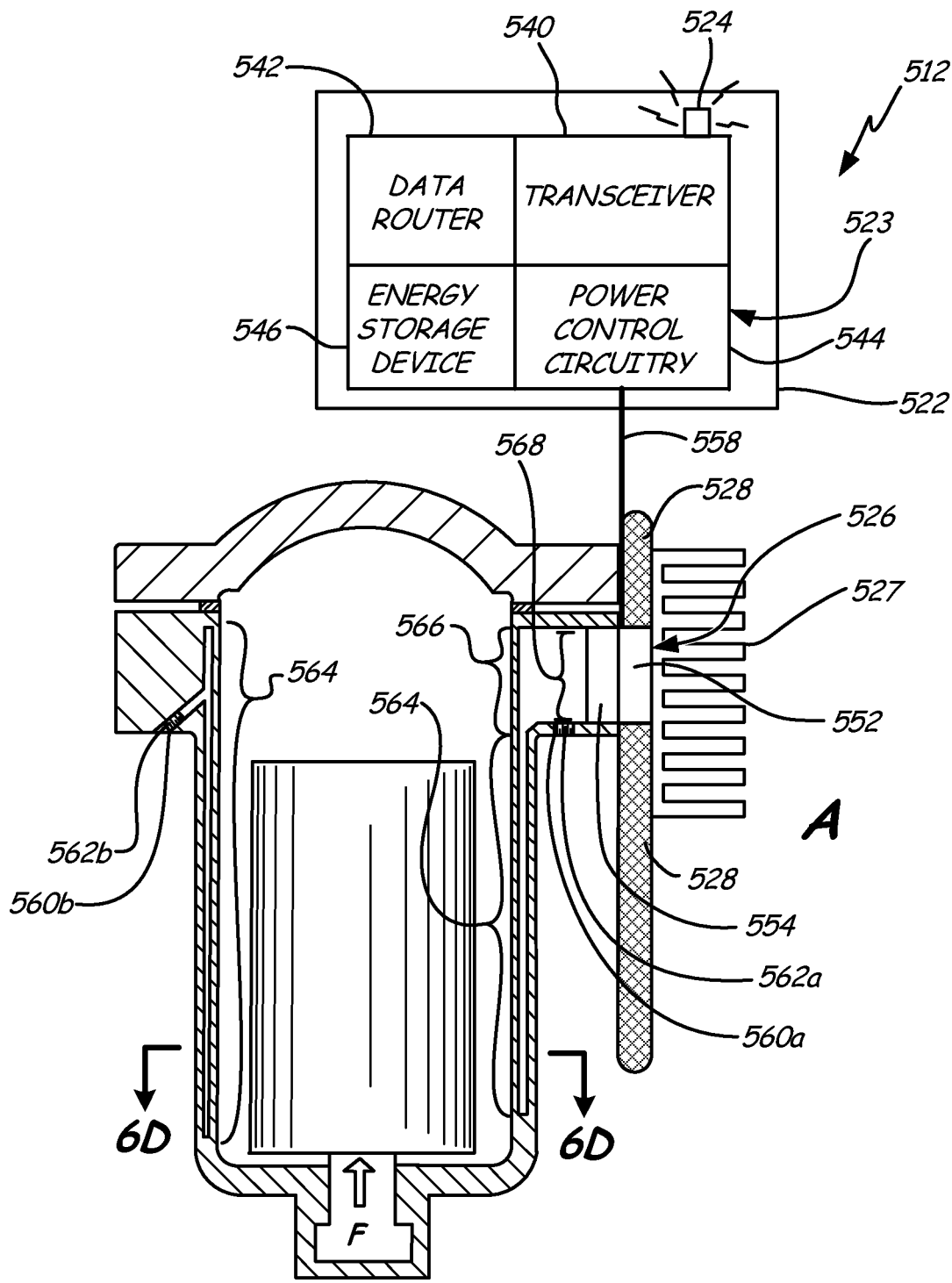

FIG. 6E is another cross-section of steam trap 514. FIG. 6E illustrates steam trap 514 rotated 90 degrees from FIG. 6C. In addition to the identically numbered elements in FIG. 6C, FIG. 6E shows thermoelectric generator assembly 526 further comprises thermoelectric element 552, and heat spreader 554. Thermoelectric element 552 and heat spreader 554 are as described in reference to FIG. 4A, with reference numbers differing by 200. Heat pipe 550 comprises fill ports 560a and 560b, plugs 562a and 562b, heat collector cavity 564, heat transport pipe 566, and heat dissipater cavity 568. Heat collector cavity 564 is that portion of heat pipe 550 imbedded within the portion of steam trap 514 that is in direct contact with steam/condensate F. Heat dissipater cavity 568 is that portion of heat pipe 550 that is in direct contact with heat spreader 554 of thermoelectric generator assembly 526. Heat transport pipe 566 is that portion of heat pipe 550 connecting heat collector cavity 564 to heat dissipater cavity 568. Heat pipe 550 further comprises a wicking device (not shown) and a working fluid present in both liquid and vapor phases (not shown); both wicking device and working fluid are as described above in reference to FIGS. 2D-2F.

Heat pipe 550 extends from heat collector cavity 564 to heat dissipater cavity 568 with heat transport pipe 566 connecting heat collector cavity 564 to heat dissipater cavity 568. Employing two fill ports on opposite sides of heat pipe 550 provides for more efficient loading of the working fluid. Heat dissipater cavity 568 of heat pipe 550 connects to thermoelectric generator assembly 526 at heat spreader 554. Heat spreader 554 is intimately attached to one side of thermoelectric element 552 and heat transfer device 527 is intimately attached to the other side of thermoelectric element 552, opposite heat spreader 554. Insulation 528 is positioned in a gap between heat transfer device 527 and the external surface of steam trap 514, extending beyond the edges of heat transfer device 527 to insure good thermal isolation between heat transfer device 527 and the exterior surfaces of steam trap 514.

Power for data transmission is supplied by the operation of thermoelectric generator assembly 526 with a heat flow efficiently supplied by heat pipe 550 as described above in reference to FIG. 4A with reference numbers increased by 200. Although the embodiment of FIGS. 6A-6E is described with a single thermoelectric generator assembly, it is understood that a second thermoelectric generator assembly, identical to the first, may be added to increase the power available to the wireless data router for application requiring, for example, more frequent communications with the wireless field device mesh network.

The embodiment of the present invention shown in FIGS. 6A-6E greatly improves the heat flux available for conversion by the thermoelectric generator by imbedding a heat pipe within a steam trap in direct contact with a flow of steam and condensate. By penetrating the steam trap wall directly, the problem of thermal resistance through the steam trap wall is eliminated as is the need to achieve a good thermal connection between the thermoelectric generator and the external surfaces of the steam trap. Also, because the heat flows into heat pipe 550 from the entire surface area of heat collector cavity 564 and is transported by the heat of vaporization from the entire internal heat collector cavity surface, the heat flux transported by heat pipe 550 can be extremely high.

FIGS. 7A-7E illustrate yet another embodiment of the present invention for powering a wireless device in a wireless field device mesh network with a thermoelectric generator incorporated into a process component, where the process component is a Venturi tube and the wireless device is a wireless flow measurement field device. As with the orifice plate flange and steam trap embodiments described above, this embodiment replaces a section of process piping through which a process fluid (or process fluid by-product) flows, instead of attaching to an external opening in a process vessel. A Venturi tube includes convergent and divergent cone sections leading to and from a cylindrical section, respectively. The cylindrical section restricts fluid flow, resulting in a lower pressure in the cylindrical section as compared to a pressure at an inlet section. Venturi tubes such as those found in, for example, the Daniel® Venturi Tube, include two pressure taps, one at the inlet section and one at the cylindrical section for transmitting fluid pressure in the Venturi tube to a DP sensor via impulse lines. The pressure differential relates to the flow rate through the Venturi tube, through the application of Bernoulli's equation. An increase in flow rate produces a larger difference between the two pressures. The two pressures transmit through the pressure taps and impulse lines to the DP sensor which directly measures the difference between the two pressures.

Figure 7A:
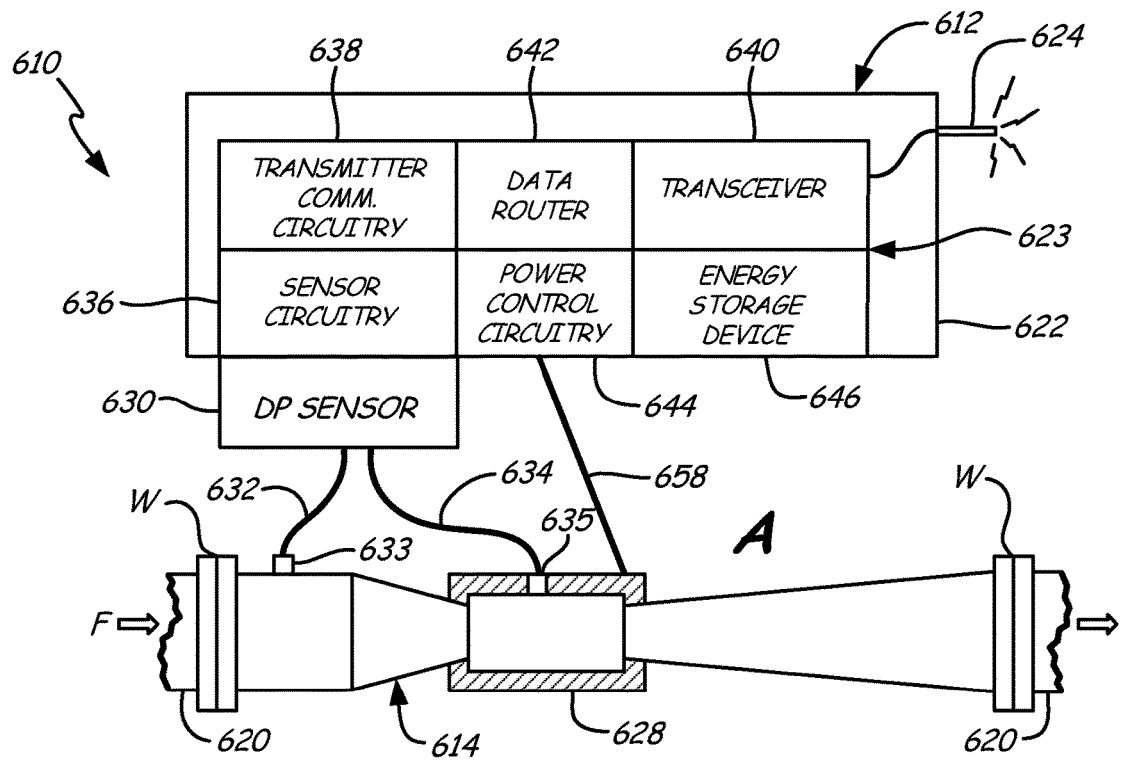
Figure 7B:
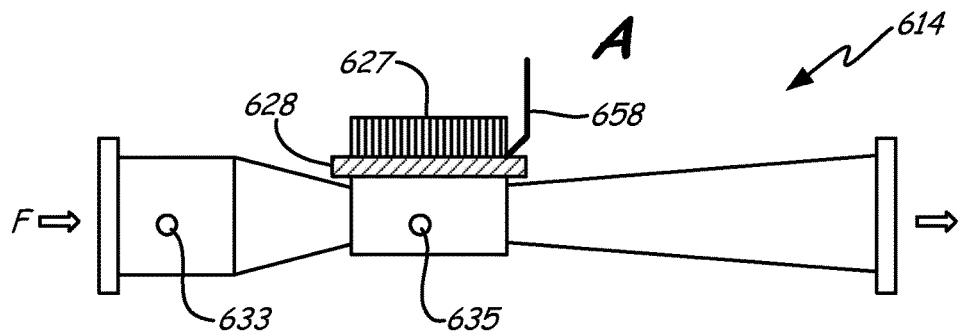

The embodiment shown in FIGS. 7A and 7B illustrates a process component incorporating the present invention where the process component is Venturi tube. FIG. 7A shows process measurement or control point 610, including wireless flow measurement field device 612, Venturi tube 614, and process piping 620 containing process fluid F. A heat sink is provided by ambient fluid A. Wireless flow measurement field device 612 comprises electronics housing 622, electronics circuitry 623, antenna 624, differential pressure (DP) sensor 630, high-side (upstream) impulse line 632, and low-side (downstream) impulse line 634 as described above with reference to FIG. 5A with reference numbers increased by 200. FIG. 7B shows Venturi tube 614 of FIG. 7A rotated 90 degrees about the flow axis. Venturi tube 614 is an in-line process component comprising high-side pressure tap 633, low-side pressure tap 635, thermoelectric generator assembly 626 (shown in FIGS. 7C and 7E), heat transfer device 627, insulation 628, and heat pipe 650 (shown in FIGS. 7C-7E). Thermoelectric generator assembly 626 comprises power cable 658. As illustrated, heat transfer device 627 is a pin-fin heat exchanger.

Considering FIGS. 7A and 7B together, Venturi tube 614 is attached to process piping 620 at flanges W by, for example, welding or bolting. Thermoelectric generator assembly 626 is integrated with Venturi tube 614 and is in thermal contact with process fluid F and ambient fluid A. Insulation 628 is positioned to thermally shield heat transfer device 627 in thermal contact with fluid A from portions of Venturi tube 614 in thermal contact with process fluid F. Impulse line 632 connects to Venturi tube 614 at pressure tap 633 by, for example, a threaded connection. Similarly, impulse line 634 connects to pressure tap 635. Impulse line 632 and impulse line 634 connect pressure tap 633 and pressure tap 635, respectively, to DP sensor 630, physically connecting wireless flow measurement field device 612 to Venturi tube 614. Connections within electronics housing 622 are as described in reference to FIG. 5A above, with reference numbers increased by 200.

FIG. 7C is a longitudinal section of Venturi tube 614 illustrating thermoelectric generator assembly 626, insulation 628, and heat pipe 650. Thermoelectric generator assembly 626 further comprises thermoelectric element 652, and heat spreader 654. Thermoelectric element 652 and heat spreader 654 are as described in reference to FIG. 4A, with reference numbers differing by 300. Heat pipe 650 comprises fill port 660, plug 662, heat collector cavity 664, heat transport pipe 666, and heat dissipater cavity 668. Heat collector cavity 664 is that portion of heat pipe 650 imbedded within the portion of Venturi tube 614 that is in direct contact with process fluid F. Heat dissipater cavity 668 is that portion of heat pipe 650 that is in direct contact with thermoelectric generator assembly 626. Heat transport pipe 666 is that portion of heat pipe 650 connecting heat collector cavity 664 to heat dissipater cavity 668. Heat pipe 650 further comprises a wicking device (not shown) and a working fluid present in both liquid and vapor phases (not shown); both wicking device and working fluid are as described above in reference to FIGS. 2D-2F.

At least some power for the flow measurement and data transmission is supplied by the operation of thermoelectric generator assembly 626 with a heat flow efficiently supplied by heat pipe 650. Heat collector cavity 664 collects heat from process fluid F. Heat transport pipe 666 transfers the heat from heat collector cavity 664 to heat dissipater cavity 668. At heat dissipater cavity 668, heat is transferred into heat spreader 654, which evens out the heat flux as the heat flow conducts through heat spreader 654 to thermoelectric element 652. As the heat flows through thermoelectric element 652 a voltage and a current are generated as a function of the amount of heat flowing through thermoelectric element 652. Power produced by thermoelectric element 652 is conducted by power cable 658 to electronics circuitry 623 within electronics housing 622 at power control circuitry 644.

As illustrated in FIG. 7C, heat collector cavity 664 extends along much of a portion of the cylindrical section of Venturi tube 614 that directly contacts process fluid F. FIG. 7D is a cross-section of Venturi tube 614 showing the cylindrical shape of heat collector cavity 664. This shape surrounds the flow of process fluid F and provides a large surface area for heat transfer from process fluid F into heat pipe 650.

FIG. 7E is another cross-section of Venturi tube 614. In addition to the identically numbered elements in FIG. 7C, FIG. 7E shows low side pressure tap 635. Heat transfer device 627 extends significantly beyond thermoelectric element 652 to provide a large ratio of surface area to volume to enhance the transfer of heat with ambient fluid A. Insulation 628 is positioned in the gap between heat transfer device 627 and the external surface of Venturi tube 614, extending well beyond the edges of heat transfer device 627 to insure good thermal isolation between heat transfer device 627 and the external surface of Venturi tube 614. As shown in FIG. 7E, heat pipe 650 is completely separate from, and does not interfere with the functioning of, low side pressure tap 635.

The embodiment of the present invention shown in FIGS. 7A-7E greatly improves the heat flux available for conversion by the thermoelectric generator by imbedding a heat pipe within a Venturi tube in direct contact with a process fluid. By penetrating the vessel wall directly, the problem of thermal resistance through the vessel wall is eliminated as is the need to achieve a good thermal connection between the thermoelectric generator and the vessel wall. Also, because the heat flows into heat pipe 650 from the entire surface area of heat collector cavity 664 and is transported by the heat of vaporization from the entire internal heat collector cavity surface, the heat flux transported by heat pipe 650 is extremely high. Although the embodiment illustrated in FIGS. 7A-7E is a Venturi tube, it is understood to apply as well to other flow tube systems, for example, a magnetic flow meter tube and a vortex tube.

FIGS. 8A-8F illustrate yet another embodiment of the present invention for powering a wireless device in a wireless field device mesh network with a thermoelectric generator incorporated into a process component, where the process component is a centrifugal pump and the wireless device is a wireless data router. As with several of the previous embodiments described above, this embodiment replaces a section of process piping through which a process fluid (or process fluid by-product) flows, instead of attaching to an external surface of a process vessel (clamp on). A pump is attached in series with process piping carrying a process fluid to increase the velocity of the fluid or to increase the pressure of the process fluid by adding kinetic energy to the process fluid. Kinetic energy is supplied in, for example, a centrifugal pump, by a rotating impeller which employs centripetal force to accelerate the process fluid in a radial direction.

Figure 8A:
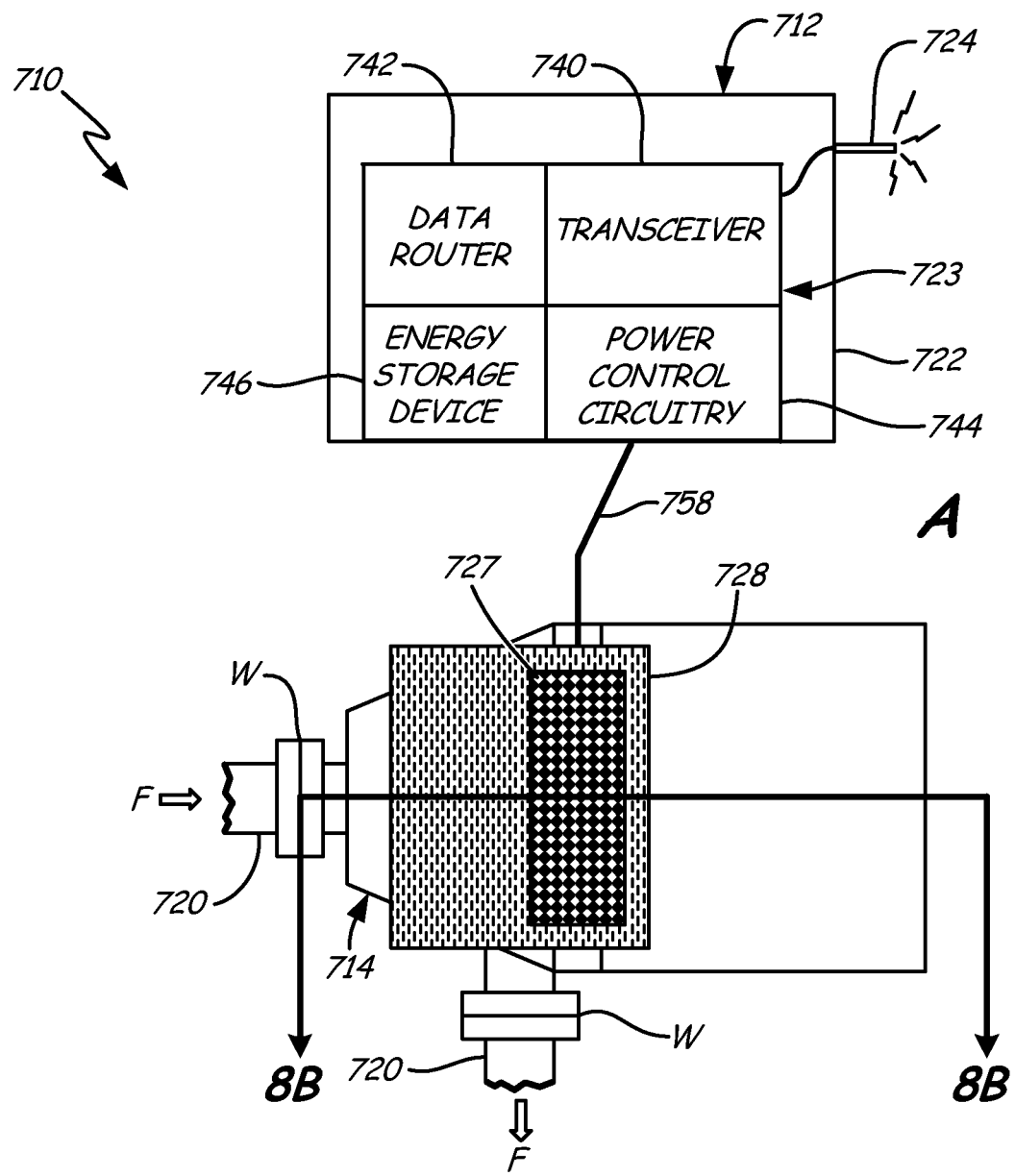
FIGS. 8A-8F illustrate an embodiment of the present invention incorporated into a pump housing for powering a wireless data router.
Figure 8B:
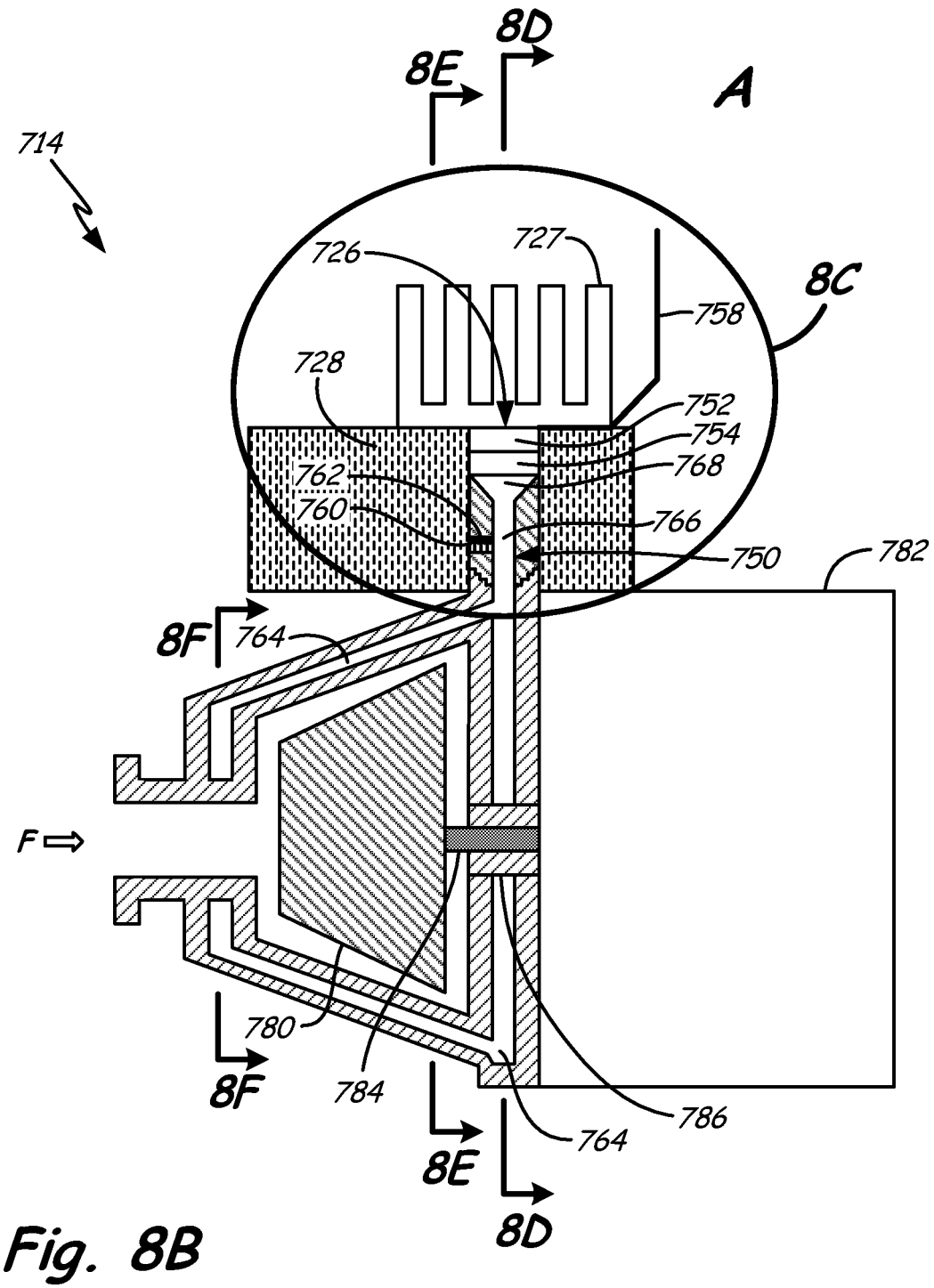
Figure 8C:
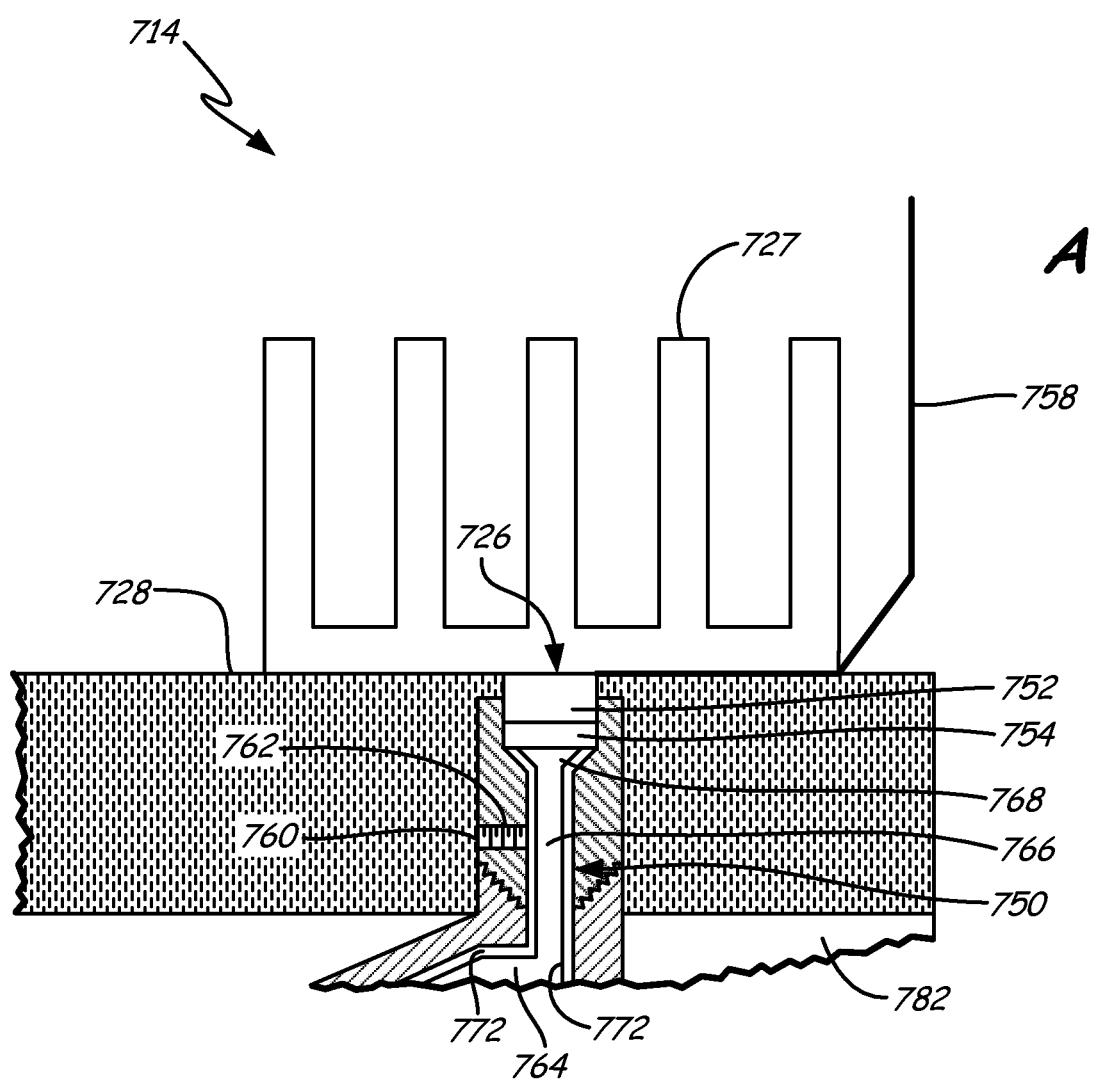

The embodiment shown in FIGS. 8A-8C illustrates a process component incorporating the present invention where the process component is a pump. FIG. 8A shows process measurement or control point 710, including wireless data router 712, pump 714, and process piping 720 containing process fluid F. A heat sink is provided by ambient fluid A. Wireless data router 712 comprises electronics housing 722, electronics circuitry 723, and antenna 724 and is as described above in reference to FIG. 6B with reference numbers increased by 200. Pump 714 is an in-line process component comprising thermoelectric generator assembly 726, heat transfer device 727, and insulation 728. As illustrated, heat transfer device 727 is a pin-fin heat exchanger.

FIG. 8B is a cross-section of pump 714 showing that pump 714 further comprises heat pipe 750, impeller 780, motor 782, shaft 784, and bearing/seal 786. The internal components of motor 782 are omitted for clarity. FIG. 8B shows pump 714 rotated 90 degrees about axis of shaft 784. FIG. 8C is a portion of FIG. 8B enlarged to better illustrate the details of thermoelectric generator assembly 726, insulation 728, and a portion of heat pipe 750. FIG. 8C shows an extended portion of pump 714 attached to the main portion of pump 714 by, for example, a threaded connection (as shown) or a welded connection. Thermoelectric generator assembly 726 comprises thermoelectric element 752, heat spreader 754, and power cable 758 and is as described above in reference to FIG. 4A with references numbers increased by 400. Heat pipe 750 comprises fill port 760, plug 762, heat collector cavity 764, heat transport pipe 766, and heat dissipater cavity 768. Heat collector cavity 764 is that portion of heat pipe 750 imbedded within the portion of pump 714 that is in direct contact with process fluid F. Heat dissipater cavity 768 is that portion of heat pipe 750 that is in direct contact with thermoelectric generator assembly 726. Heat transport pipe 766 is that portion of heat pipe 750 connecting heat collector cavity 764 to heat dissipater cavity 768. Heat pipe 750 further comprises a wicking device 772 and a working fluid present in both liquid and vapor phases (not shown); both wicking device 772 and working fluid are as described above in reference to FIGS. 2D-2F. Impeller 780 is a generally frustoconical shaped device with blades that accelerate process fluid F when impeller 780 spins to produce increased velocity of, or higher pressure in, process fluid F as it exits pump 714. Motor 782 is any sort of motor, such as an electric motor. Shaft 784 is a durable, generally cylindrically shaped device for connecting motor 782 to impeller 780 to spin impeller 780. Bearing/seal 786 is a device that permits the passage and rotation of shaft 784 while largely preventing leakage of process fluid F past shaft 784.

Considering FIGS. 8A, 8B, and 8C together, pump 714 is attached to process piping 720 at flanges W by, for example, welding or bolting. Thermoelectric generator assembly 726 is integrated with pump 714 and is in thermal contact with process fluid F and ambient fluid A. Connections within electronics housing 722 are as described in reference to FIG. 6B above, with reference numbers increased by 200. Heat pipe 750 extends from heat collector cavity 764 to heat dissipater cavity 768 with heat transport pipe 766 connecting heat collector cavity 764 to heat dissipater cavity 768. Heat dissipater cavity 768 of heat pipe 750 connects to thermoelectric generator assembly 726 at heat spreader 754. Heat spreader 754 is intimately attached to one side of thermoelectric element 752 and heat transfer device 727 is intimately attached to the other side of thermoelectric element 752, opposite heat spreader 754.

In operation, motor 782 spins impeller 780 via shaft 784, drawing process fluid F into pump 714, and accelerating process fluid F to produce increased velocity of, or higher pressure in, process fluid F as it exits pump 714. Wireless data router 712 operates as described in reference to FIG. 6B above with reference numbers increased by 200.

At least a portion of the power for the operation of wireless data router 712 is supplied in the embodiment of the present invention by the operation of thermoelectric generator assembly 726 with a heat flow efficiently supplied by heat pipe 750 as described above in reference to FIG. 4A with reference numbers increased by 400.

Figure 8D:
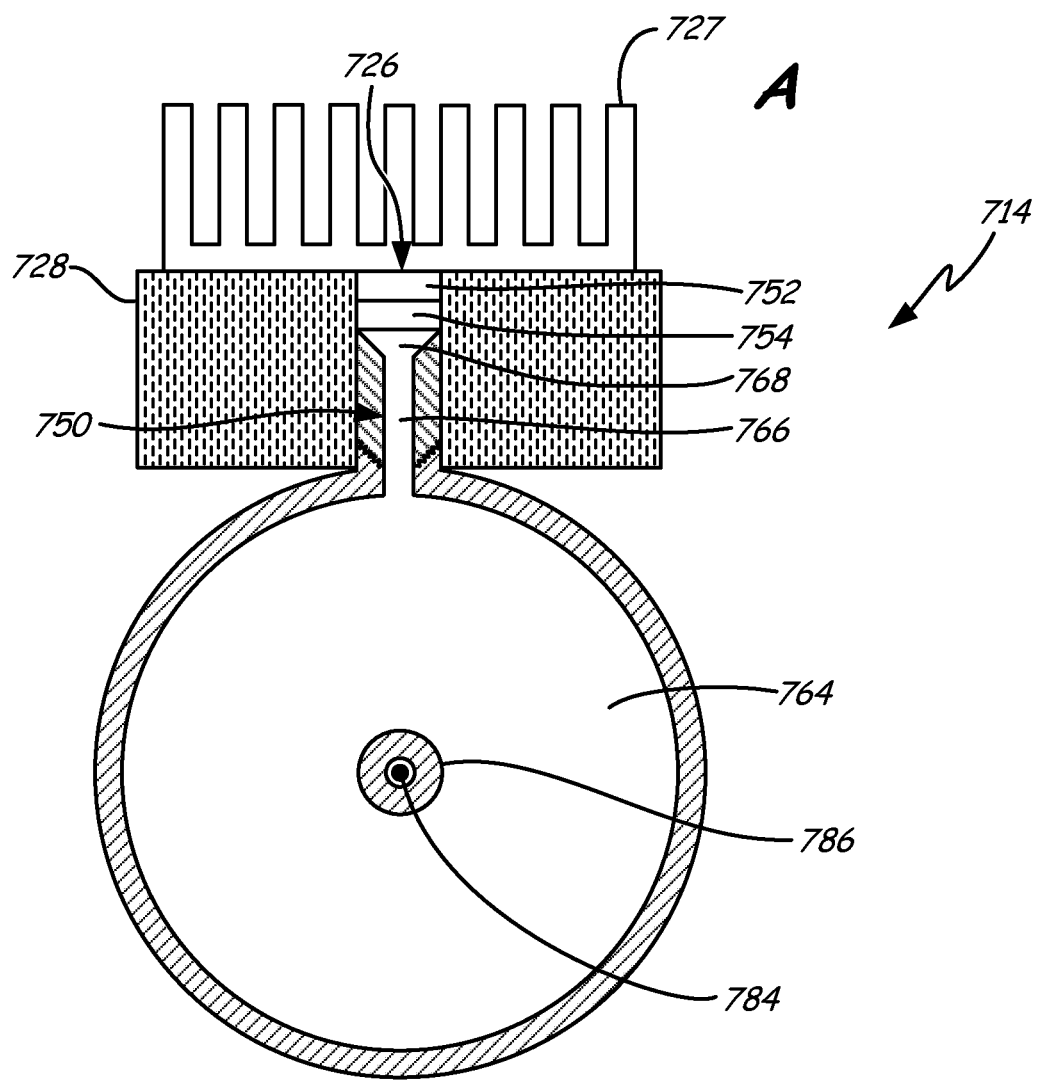
Figure 8E:
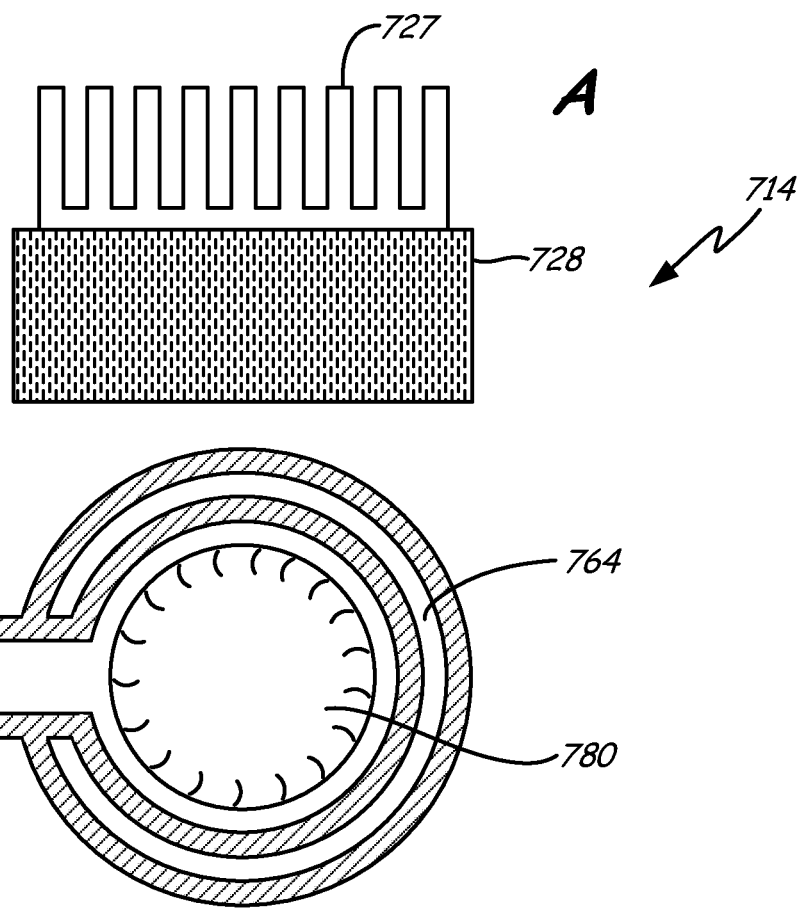
Figure 8F:
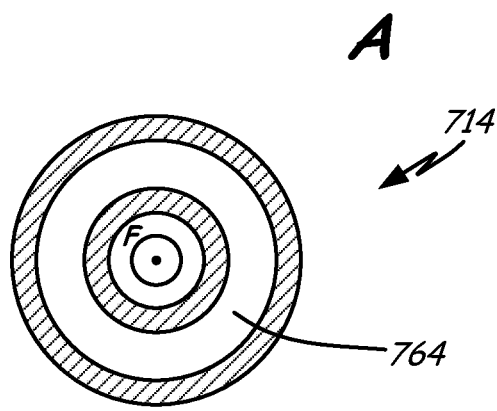

As illustrated in FIG. 8B, heat collector cavity 764 lines the interior of pump 714 collecting heat from process fluid F as it is pumped through pump 714 by impeller 780. FIGS. 8D-8F are axial cross-sections of pump 714 further illustrating the shape of heat collector cavity 764. Taken together, FIGS. 8B and 8D-8F show that heat collector cavity 764 surrounds the interior of pump 714, except for openings necessary for the inlet (FIGS. 8B and 8F), outlet (FIG. 8E), and seal/bearing 786 (FIGS. 8B and 8D). By surrounding the interior of pump 714, a large surface area is provided for heat transfer from process fluid F into heat pipe 750.

The embodiment of the present invention shown in FIGS. 8A-8F greatly improves the heat flux available for conversion by the thermoelectric generator by imbedding a heat pipe within a pump in direct contact with a process fluid. By penetrating the pump wall directly, the problem of thermal resistance through the pump wall is eliminated as is the need to achieve a good thermal connection between the thermoelectric generator and the external surfaces of the pump. Also, because the heat flows into heat pipe 750 from the entire surface area of heat collector cavity 764 and is transported by the heat of vaporization from the entire internal heat collector cavity surface, the heat flux transported by heat pipe 750 is extremely high. Although the embodiment of FIGS. 8A-8F is described as a centrifugal pump, it is understood to apply to any type of pump.

Figure 9A:
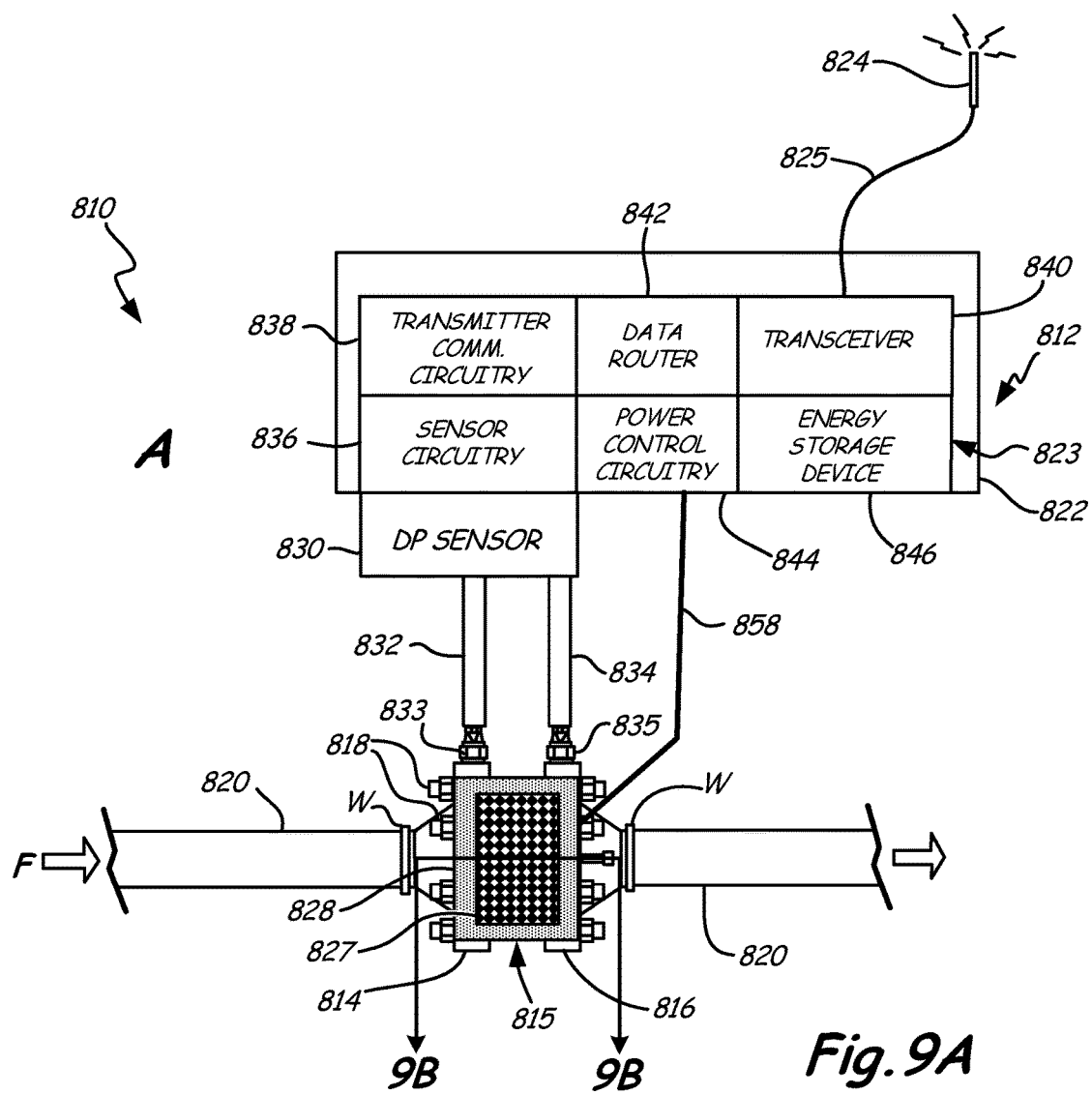
FIGS. 9A-9C illustrate an embodiment of the present invention incorporated into an orifice plate for powering a wireless flow measurement field device.
Figure 9B:
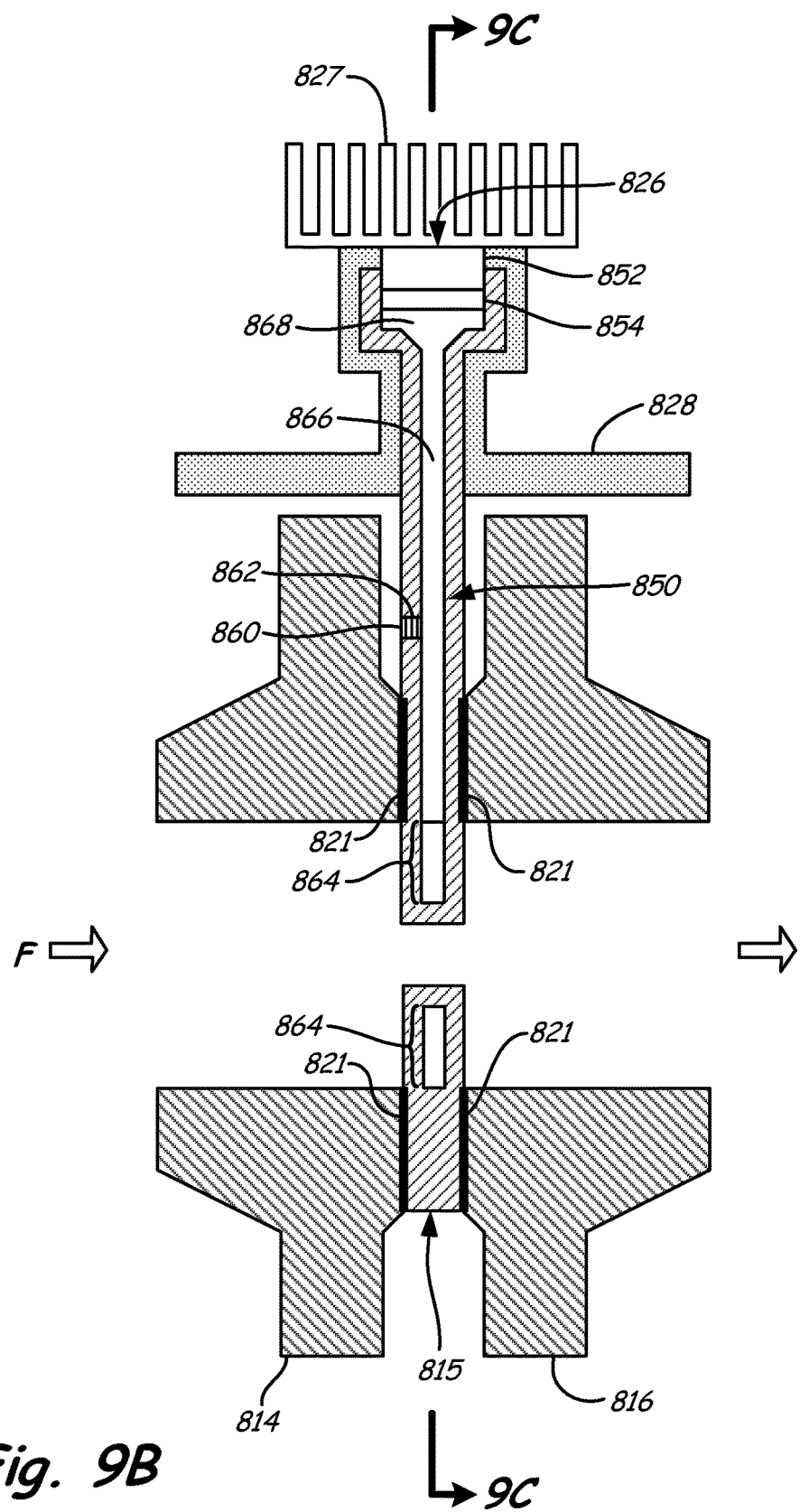
Figure 9C:
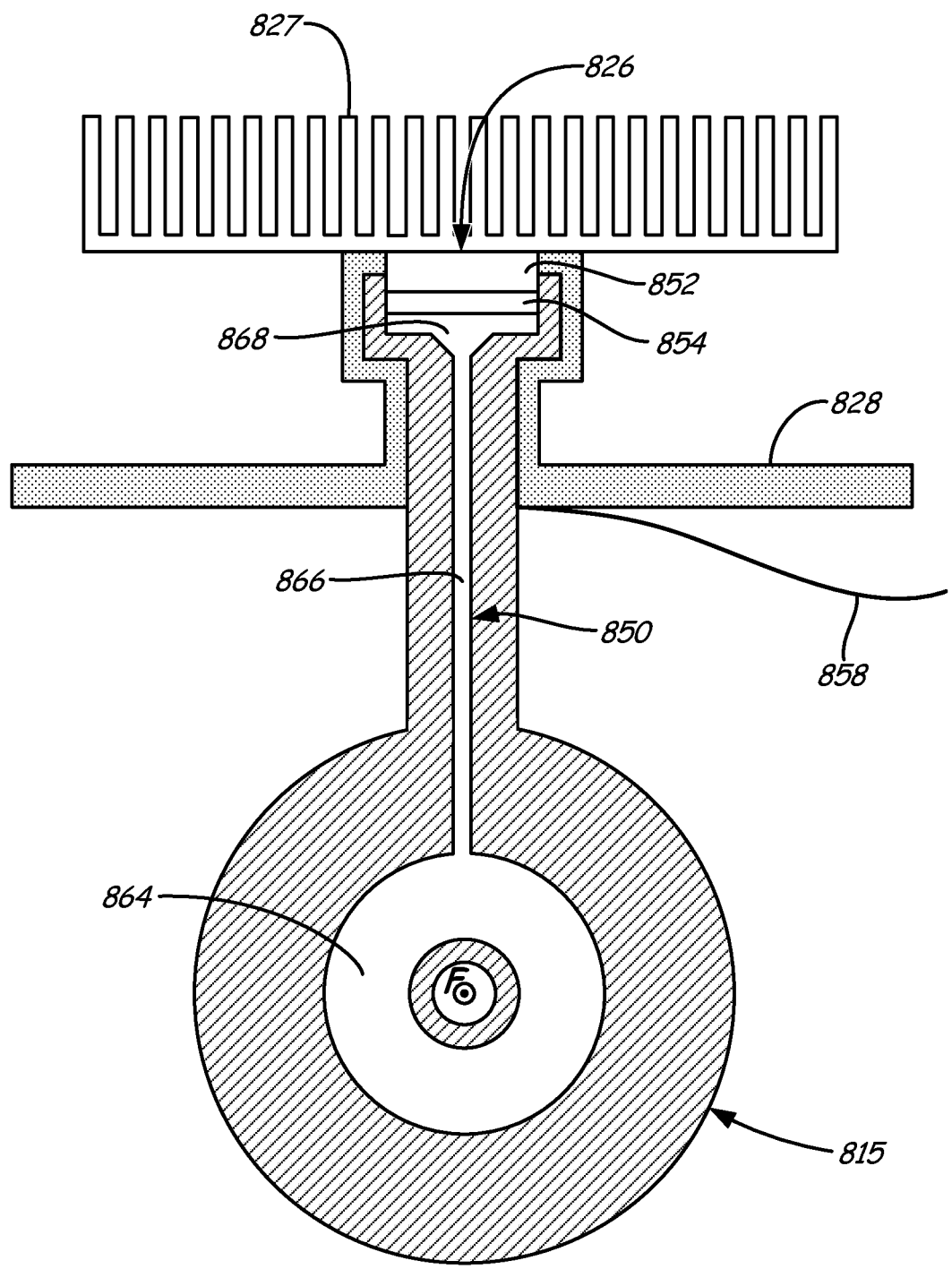

FIGS. 9A-9C illustrate yet another embodiment of the present invention for powering a wireless device in a wireless field device mesh network with a thermoelectric generator incorporated into a process component, where the process component is an orifice plate and the wireless device is a wireless flow measurement field device Like some of the embodiments described above, this embodiment replaces a section of process piping through which a process fluid (or process fluid by-product) flows, instead of attaching to an external opening in a process vessel. Orifice plates such as for example, a ROSEMOUNT® 1495 orifice plate, positioned between two orifice plate flanges cause a pressure drop across the orifice plate as the fluid is forced to flow through the orifice, resulting in two different fluid pressures being transmitted to the DP sensor, as described above in reference to FIGS. 5A-5F.

FIGS. 9A-9C illustrate a process component incorporating the present invention where the process component is an orifice plate. FIG. 9A shows process measurement or control point 810, including wireless flow measurement field device 812, orifice plate flange 814, orifice plate 815, orifice plate flange 816, stud/nuts 818 and process piping 820 containing process fluid F. A heat sink is provided by ambient fluid A. Wireless flow measurement field device 812 comprises electronics housing 822, electronics circuitry 823, antenna 824, RF cable 825, differential pressure (DP) sensor 830, high-side (upstream) impulse line 832, and low-side (downstream) impulse line 834. DP sensor 830, impulse lines 832 and 834, and electronics circuitry 823 are as described above in reference to FIG. 5A, with reference numbers increased by 400. Orifice plate flange 814 and 816, such as those found in, for example, a ROSEMOUNT® 1496 flange union, include high-side pressure tap 833 and low-side pressure tap 835, respectively. Orifice plate 815 is an in-line process component comprising thermoelectric generator assembly 826 (shown in FIGS. 9B-9C), heat transfer device 827, insulation 828, and heat pipe 850 (shown in FIGS. 9B-9C). Together, orifice plate flange 814, orifice plate 815, orifice plate flange 816, studs/nuts 818, and two sealing gaskets 821 (shown in FIG. 9B) comprise an orifice plate flange union. Thermoelectric generator assembly 826 comprises power cable 858. As illustrated, heat transfer device 827 is a pin-fin heat exchanger.

Orifice plate flanges 814 and 816 attach to process piping 820 at points W by, for example, welding. Orifice plate 815 is inserted between orifice plate flange 814 and orifice plate flange 816 with a sealing gasket 821 between orifice plate 815 and orifice plate flange 814 and another sealing gasket 821 between orifice plate 815 and orifice plate flange 816. Orifice plate flange 814, orifice plate 815, orifice plate flange 816, and the two gaskets are bolted together by a plurality of stud/nuts 818. Thermoelectric generator assembly 826 is integrated with orifice plate 815 and is in thermal contact with process fluid F and ambient fluid A. Insulation 828 is positioned to thermally shield heat transfer device 827 in thermal contact with fluid A from portions of orifice plate 815 in thermal contact with process fluid F. Antenna 824 is located remotely from electronics housing 822 and is connected to electronics circuitry 823 by RF cable 825. All other connections are as described above in reference to FIG. 5A, with reference numbers increased by 400. Operation is also as described above in reference to FIG. 5A.

At least a portion of power for the flow measurement and data transmission described above is supplied to wireless flow measurement field device 812 in the embodiment of the present invention by the operation of thermoelectric generator assembly 826 with a heat flow efficiently supplied by heat pipe 850 as described in detail in FIGS. 9B-9C. A heat flow driven by the temperature difference between process fluid F and ambient fluid A is transported by heat pipe 850 in orifice plate 815. The heat flow is conducted through thermoelectric generator assembly 826 by the dissipation of the heat into ambient fluid A by heat transfer device 827, generating electrical power.

FIGS. 9B and 9C are longitudinal and axial cross-sections, respectively, of orifice plate 815 illustrating thermoelectric generator assembly 826, insulation 828, and heat pipe 850. Considering FIGS. 9B and 9C together, thermoelectric generator assembly 826 comprises thermoelectric element 852, heat spreader 854, and power cable 858. Thermoelectric element 852 and heat spreader 854 are as described in reference to FIG. 4A, with reference numbers increased by 500. Heat pipe 850 comprises fill port 860, plug 862, heat collector cavity 864, heat transport pipe 866, and heat dissipater cavity 868. Heat collector cavity 864 is that portion of heat pipe 850 imbedded within the portion of orifice plate 815 that is in direct contact with process fluid F. Heat dissipater cavity 868 is that portion of heat pipe 850 that is in direct contact with thermoelectric generator assembly 826. Heat transport pipe 866 is that portion of heat pipe 850 connecting heat collector cavity 864 to heat dissipater cavity 868. Heat pipe 850 further comprises a wicking device (not shown) and a working fluid present in both liquid and vapor phases (not shown); both wicking device and working fluid are as described above in reference to FIGS. 2D-2F.

Heat pipe 850 extends from heat collector cavity 864 to heat dissipater cavity 868 with heat transport pipe 866 connecting heat collector cavity 864 to heat dissipater cavity 868. Heat dissipater cavity 868 of heat pipe 850 connects to thermoelectric generator assembly 826 at heat spreader 854. Heat spreader 854 is intimately attached to one side of thermoelectric element 852 and heat transfer device 827 is intimately attached to the other side of thermoelectric element 852, opposite heat spreader 854. Power cable 858 connects thermoelectric element 852 to electronics circuitry 823 within electronics housing 822 at power control circuitry 844 (shown in FIG. 9A).

Power for the flow measurement and data transmission is supplied by the operation of thermoelectric generator assembly 826 with a heat flow efficiently supplied by heat pipe 850 as described above in reference to FIG. 4A with reference numbers increased by 500. As illustrated in FIGS. 9B and 9C, heat collector cavity 864 extends along much of a portion of orifice plate 815 that is proximate process fluid F.

The embodiment of the present invention shown in FIGS. 9A-9C greatly improves the heat flux available for conversion by the thermoelectric generator by imbedding a heat pipe within an orifice plate in direct contact with a process fluid. By penetrating the vessel wall directly, the problem of thermal resistance through the vessel wall is eliminated as is the need to achieve a good thermal connection between the thermoelectric generator and the vessel wall. Also, because the heat flows into heat pipe 850 from the entire surface area of heat collector cavity 864 and is transported by the heat of vaporization from the entire internal heat collector cavity surface, the heat flux is efficiently transported by heat pipe 850. Finally, orifice plates are designed to be quickly and easily changed. Thus, an orifice plate embodying the present invention, such as that shown in FIGS. 9A-9C, can easily replace an orifice plate not embodying the invention to supply power to a wireless device.

All embodiments described above are shown with a heat transfer device illustrated as a pin-fin heat exchanger. However, it is understood that a heat transfer device is any device for efficiently exchanging heat with ambient fluid A. Another example of a heat transfer device is a finned heat exchanger. Still another example of a heat transfer device is a device employing a second heat pipe in thermal contact with the side of the thermoelectric element opposite the heat spreader to further enhance the transfer of heat into the ambient fluid.

FIG. 10 illustrates an embodiment of the present invention incorporated into each of two process components for powering a wireless flow measurement field device. This embodiment differs from all embodiments described above in that, for each of the two process components, the heat sink is the process fluid in the other process component. Also, for each of the two process components, the heat transfer device is the other process component's heat pipe. FIG. 10 is a cross-section of orifice plate flanges 914a and 914b. Orifice plate flanges 914a and 914b are each identical in form and function to orifice plate flange 414 as described in reference to FIGS. 5A-5F except for the following differences. The extended portion of each orifice plate flange 914a and 914b includes flange connection 988a and 988b, respectively. In addition, insulation 928a and 928b extend up the extended portion of orifice plate flange 914a and 914b only to flange connections 988a and 988b, respectively. Orifice plate flanges 914a and 914b share thermoelectric generator assembly 926, which includes thermoelectric element 952, first heat spreader 954a, second heat spreader 954b, and power cable 958. Finally, the heat transfer device for orifice plate flange 914a is heat pipe 950b of orifice plate flange 914b; similarly, the heat transfer device for orifice plate flange 914b is heat pipe 950a of orifice plate flange 914a. The embodiment shown in FIG. 10 also comprises interface gasket 990, clamp gaskets 992, and clamps 994. Interface gasket 990 and clamp gaskets 992 are a compressible gasket material that is also a thermal insulator.

Orifice plate flanges 914a and 914b are connected at thermoelectric generator assembly 926, with heat pipe 950a connecting to thermoelectric generator assembly 926 at heat spreader 954a, and heat pipe 950b connecting to thermoelectric generator assembly 926 at heat spreader 954b. Heat spreader 954a is in intimate contact with one side of thermoelectric element 952 and heat spreader 954b of thermoelectric generator assembly 926 in intimate contact with the other side of thermoelectric element 952, opposite heat spreader 954a. Power cable 958 connects thermoelectric element 952 to a wireless device of any type as shown in the previous embodiments. The connection between orifice plate flanges 914a and 914b supported by flange connections 988a and 988b held together by clamp 994. Clamp gaskets 992, between clamp 994 and flange connections 988a and 988b limit the flow of heat around thermoelectric element 952 via clamp 994. Similarly, interface gasket 990, between flange connections 988a and 988b, limits the flow of heat around thermoelectric element 952 via flange connections 988a and 988b.

As shown in FIG. 10, heat transfer pipes 966a and 966b of heat pipe 950a and 950b, respectively, are formed of a flexible tube instead of a rigid structure. This allows for easier connection of flange connection 988a to flange connection 988b than if the heat transfer portions of each of heat pipe 950a and 950b were a rigid structure. The flexible tube is preferably a thin-walled metal tube, such as, for example, an armored sleeve for a capillary-style seal connection for a ROSEMOUNT® 1199 diaphragm seal system.

In operation, a heat flow is driven by the temperature difference between process fluid F1 in contact with orifice plate flange 914a and process fluid F2 in contact with orifice plate flange 914b, with, for example, the temperature of process fluid F1 greater than the temperature of process fluid F2. The heat flow is transported from process fluid F1 by heat pipe 950a in orifice plate flange 914a to heat spreader 954a. The heat flow is conducted through thermoelectric generator 952 to heat spreader 954b by the transport of the heat flow from heat spreader 954b by heat pipe 950b to process fluid F2 in orifice plate flange 914b. The conduction of the heat flow through thermoelectric generator 952 generates electrical power, which is conducted over power cable 958 to a wireless device of any type as shown in the previous embodiments.

The embodiment of the present invention shown in FIG. 10 greatly improves the heat flux available for conversion by the thermoelectric generator by imbedding a heat pipe within each of two orifice plate flanges, each orifice plate flange in direct contact with a process fluid at a temperature different than that of the other orifice plate flange. By penetrating the vessel walls directly, the problem of thermal resistance through the vessel walls is eliminated as is the need to achieve a good thermal connection between the thermoelectric generator and the vessel walls. In addition, the embodiment of FIG. 10 may produce larger and/or more controllable heat flows by control of the temperatures of the process fluid in contact with each of the two orifice plate flanges.

All embodiments above are described with a heat pipe that preferably employs a wicking device to permit operation of the heat pipe in all orientations. The wicking device permits movement of the denser liquid phase working fluid from the heat dissipater cavity to the heat collector cavity regardless of the orientation of the heat pipe, including against the force of gravity. It is understood that for all embodiments, the wicking device may be omitted if the orientation of the device places the heat dissipater cavity above the heat collector cavity such that the vapor phase working fluid rises to the heat dissipater cavity and the liquid phase working fluid flows downward to the heat collector cavity, the vapor phase working fluid being much less dense than the liquid phase working fluid.

In some embodiments above, the antenna is shown mounted to the exterior of the electronics housing and electrically connected to the transceiver. In other embodiments it is shown mounted remotely and connected to the electronics housing by an RF cable or mounted completely within the electronics housing, for example, a component mounted on a circuit board or a component integrated with a circuit board. It is understood that any of the embodiments may employ any of these integrated antenna styles as desired.

As shown above in reference to FIG. 10, a heat transfer pipe of a heat pipe in the present invention may be formed of a flexible tube instead of a rigid structure. Although illustrated only for the embodiment shown in FIG. 10, it is understood that in all of the embodiments, the heat transfer pipe of the heat pipe may be formed at least in part, by a flexible tube instead of a rigid structure. This may allow for easier connection of a thermoelectric assembly to a heat transfer device for a particular heat sink, such as large structure, for example, earth or an earthen berm. In addition, in the case of a heat transfer device that is, for example, a pin-fin heat exchanger and the heat sink is, for example, ambient air, a flexible tube structure permits easy adjustment and orientation of the pin-fin heat exchanger for improved natural convection, resulting in improved performance of the heat transfer device. Finally, employing a flexible tube structure for at least a portion of the heat transfer pipe of the heat pipe provides vibration isolation between portions of the process component in contact with the process fluid and the thermoelectric generator assembly. In high-vibration process environments, this enhances the reliability of the thermoelectric generator assembly.

The various embodiments provide power to a wireless device in a wireless field device network by employing a thermoelectric generator incorporated into a process component. The process component directly contacts a process fluid and contains a heat pipe formed in part by a heat collector cavity internal to the process component. The heat collector cavity is employed solely to form a portion of the heat pipe. The heat pipe couples to one side of the thermoelectric generator and a heat sink couples to the other side of the thermoelectric generator, transferring heat through the thermoelectric generator to generate electrical power for the wireless device. Imbedding the heat pipe within a process component in direct contact with the process fluid eliminates thermal resistances by penetrating a vessel wall directly. By penetrating the vessel wall directly, losses associated with thermal resistance through the vessel wall are eliminated as is the need to achieve a good thermal connection between the thermoelectric generator and the exterior wall of the vessel. In addition, because heat flows into the heat pipe from the entire surface area of the heat collector cavity and is transported by the heat of vaporization from the entire internal heat collector cavity surface, the heat flux transported by the heat pipe is extremely high. Finally, because a process component incorporating the present invention can be assembled at a factory under precisely controlled conditions, consistent, reliable operation is much more likely than with a thermoelectric generator strapped on to a vessel out in the field.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. An apparatus comprising:
   a first process component having a transducer and configured to penetrate or replace a section of a vessel wall so as to directly contact a first process fluid, the first process component having a barrier wall configured to physically isolate the transducer from the first process fluid, the first process component having a first cavity located within the barrier wall of the first process component that contacts the first process fluid so that heat from the first process fluid is transferred through a portion of the barrier wall to the first cavity;
   a first heat pipe formed in part by the first cavity, the first heat pipe comprising a sealed cavity containing a first working fluid; and
   a thermoelectric generator assembly; wherein the first heat pipe has a first end located within the barrier wall and positioned to transfer heat from the first process fluid to the first working fluid and has a second end thermally coupled to a first side of the thermoelectric generator assembly to transfer heat from the first working fluid to the first side of the thermoelectric generator assembly; wherein a heat sink is thermally coupled to a second side of the thermoelectric generator assembly; and wherein the thermoelectric generator assembly produces electrical power.

2. The apparatus of claim 1, wherein the first process component is one of a pipe flange, an orifice plate flange, an orifice plate, a thermowell, an averaging pitot tube, a stream trap, a flow tube, a flow straightening element, a control valve, a shut-off valve, a pressure relief valve, a pressure manifold, a valve manifold, a pump housing, a filter housing, a pressure sensor remote seal, a level switch, a contacting radar level gauge, a vortex flow meter, a coriolis meter, a magnetic flow meter, a turbine meter, and a flow restrictor.

3. The apparatus of claim 1, wherein the heat sink is at least one of ambient air, water, a second process fluid, earth, a building, and an earthen berm.

4. The apparatus of claim 1, wherein the first working fluid comprises at least one of water, ammonia, methanol, and ethanol.

5. The apparatus of claim 1, wherein the first heat pipe is further formed in part by a flexible tube.

6. The apparatus of claim 1, wherein the first heat pipe further comprises a wicking device.

7. The apparatus of claim 6, wherein the wicking device is comprised of at least one of a sintered ceramic, metal mesh, metal felt, metal foam, and grooves on the interior surface of the heat pipe.

8. The apparatus of claim 1, further comprising:
   a heat transfer device; and
   the thermoelectric generator assembly comprises:
      a first heat spreader; and
      a thermoelectric element, wherein the first heat spreader is attached to a first side of the thermoelectric element to thermally couple the first side of the thermoelectric generator assembly to the first heat pipe; and
      wherein the heat transfer device thermally couples the heat sink to the second side of the thermoelectric generator assembly.

9. The apparatus of claim 8, further comprising thermal insulation between at least a portion of the first process component and the heat transfer device.

10. The apparatus of claim 8, wherein the heat transfer device comprises at least one of a pin-fin heat exchanger and a finned heat exchanger.

11. The apparatus of claim 8, wherein:
    the thermoelectric generator assembly further comprises a second heat spreader;
    the heat transfer device comprises a second heat pipe; and
    the second heat spreader is attached to a second side of the thermoelectric element to thermally couple the second side of the thermoelectric generator assembly to the second heat pipe.

12. A system comprising:
    a wireless field device network;
    a wireless device in wireless communication with the wireless field device network; and
    a first process component having a transducer and configured to penetrate or replace a section of a vessel wall so as to directly contact a first process fluid, the first process component having a barrier wall configured to physically isolate the transducer from the first process fluid, the first process component having a first cavity located within the barrier wall of the first process component that contacts the first process fluid so that heat from the first process fluid is transferred through a portion of the barrier wall to the first cavity;
    a first heat pipe formed in part by the first cavity, the first heat pipe comprising a sealed cavity containing a first working fluid; and
    a thermoelectric generator assembly, wherein the first heat pipe has a first end located within the barrier wall and positioned to transfer heat from the first process fluid to the first working fluid and has a second end thermally coupled to a first side of the thermoelectric generator assembly to transfer heat from the first working fluid to the first side of the thermoelectric generator assembly, and wherein a heat sink is thermally coupled to a second side of the thermoelectric generator assembly;
    wherein the thermoelectric generator assembly provides electrical power to the wireless device.

13. The system of claim 12, wherein the process component is one of a pipe flange, an orifice plate flange, an orifice plate, a thermowell, an averaging pitot tube, a stream trap, a flow tube, a flow straightening element, a control valve, a shut-off valve, a pressure relief valve, a pressure manifold, a valve manifold, a pump housing, a filter housing, a pressure sensor remote seal, a level switch, a contacting radar level gauge, a vortex flow meter, a coriolis meter, a magnetic flow meter, a turbine meter, and a flow restrictor.

14. The system of claim 12, wherein the first heat pipe further comprises a wicking device.

15. The system of claim 12, further comprising:
   a heat transfer device; and
   the thermoelectric generator assembly comprises:
      a first heat spreader, and
      a thermoelectric element,
      wherein the first heat spreader is attached to a first side of the thermoelectric element to thermally couple the first side of the thermoelectric generator assembly to the first heat pipe; and
   wherein the heat transfer device thermally couples the heat sink to the second side of the thermoelectric generator assembly.

16. The apparatus of claim 15, further comprising thermal insulation between at least a portion of the first process component and the heat sink.

* * * * *